US006734573B2

United States Patent
Okada

(10) Patent No.: US 6,734,573 B2
(45) Date of Patent: May 11, 2004

(54) SEMICONDUCTOR MEMORY HAVING ACCESS TRANSISTORS FORMED IN A SINGLE WELL AND DRIVER TRANSISTORS FORMED IN WELLS DIFFERENT FROM THE SINGLE WELL

(75) Inventor: Yoshinori Okada, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/308,060

(22) Filed: Dec. 3, 2002

(65) Prior Publication Data

US 2004/0007785 A1 Jan. 15, 2004

(30) Foreign Application Priority Data

Jul. 9, 2002 (JP) .......................... 2002-199619

(51) Int. Cl.[7] .............................................. H01L 27/11
(52) U.S. Cl. ....................................... 257/903; 257/206
(58) Field of Search ........................... 257/903, 376, 257/429, 544, 380, 373; 365/154; 437/52

(56) References Cited

U.S. PATENT DOCUMENTS 5,135,882 A * 8/1992 Karniewicz ................. 438/385
5,338,963 A    8/1994 Klaasen et al. ................ 1/1
5,774,408 A * 6/1998 Shirley ................... 365/230.03
6,147,899 A * 11/2000 Chan ......................... 365/156

FOREIGN PATENT DOCUMENTS

JP       7-7089       1/1995

* cited by examiner

*Primary Examiner*—David Nelms
*Assistant Examiner*—Thinh T Nguyen
(74) *Attorney, Agent, or Firm*—Oblon, Spivak, McClelland, Maier & Neustadt, P.C.

(57) ABSTRACT

A memory cell (10) is a so-called CMOS type cell. P-wells (W1P, W2P, W3P) and N-wells (W4N, W5N) are formed in a main surface (5S) of a semiconductor substrate (5), and the wells (W2P, W4N, W1P, W5N, W3P) are aligned in this order. Driver transistors (11DN, 12DN) are formed in the wells (W2P, W3P), respectively. Load transistors (11LP, 12LP) are formed in the wells (W4N, W5N), respectively. Two access transistors (11AN, 12AN) are formed in the single well (W1P). N$^+$-type impurity regions (FN30, FN10) constituting one of storage nodes are provided in different wells, and N$^+$-type impurity regions (FN31, FN11) constituting the other of the storage nodes are also provided in different wells.

7 Claims, 21 Drawing Sheets

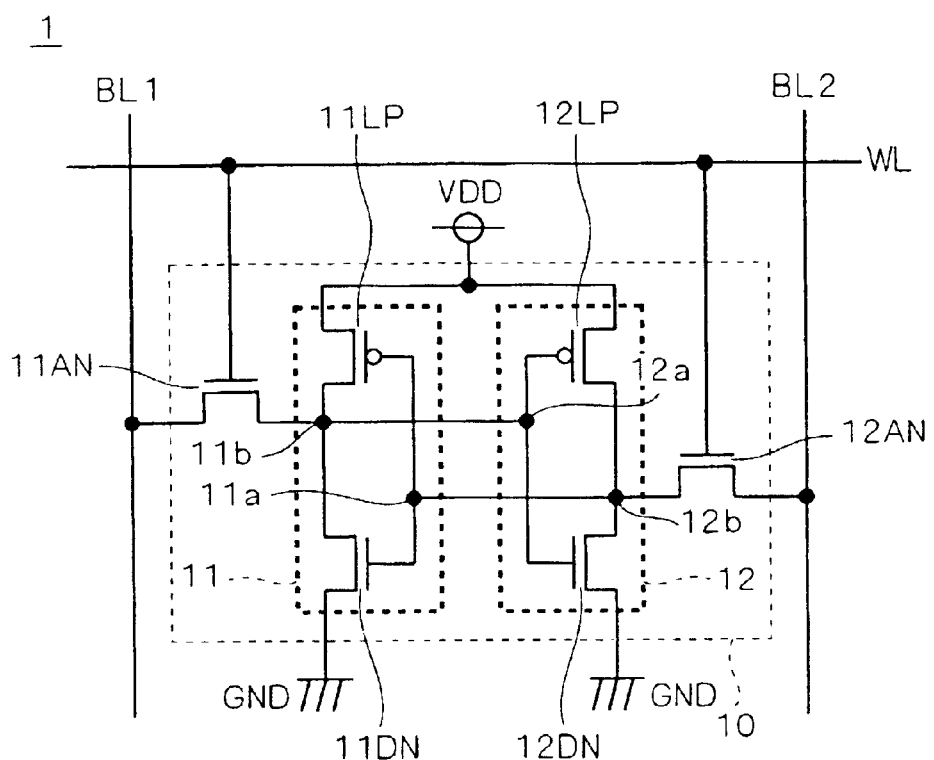
F I G . 1

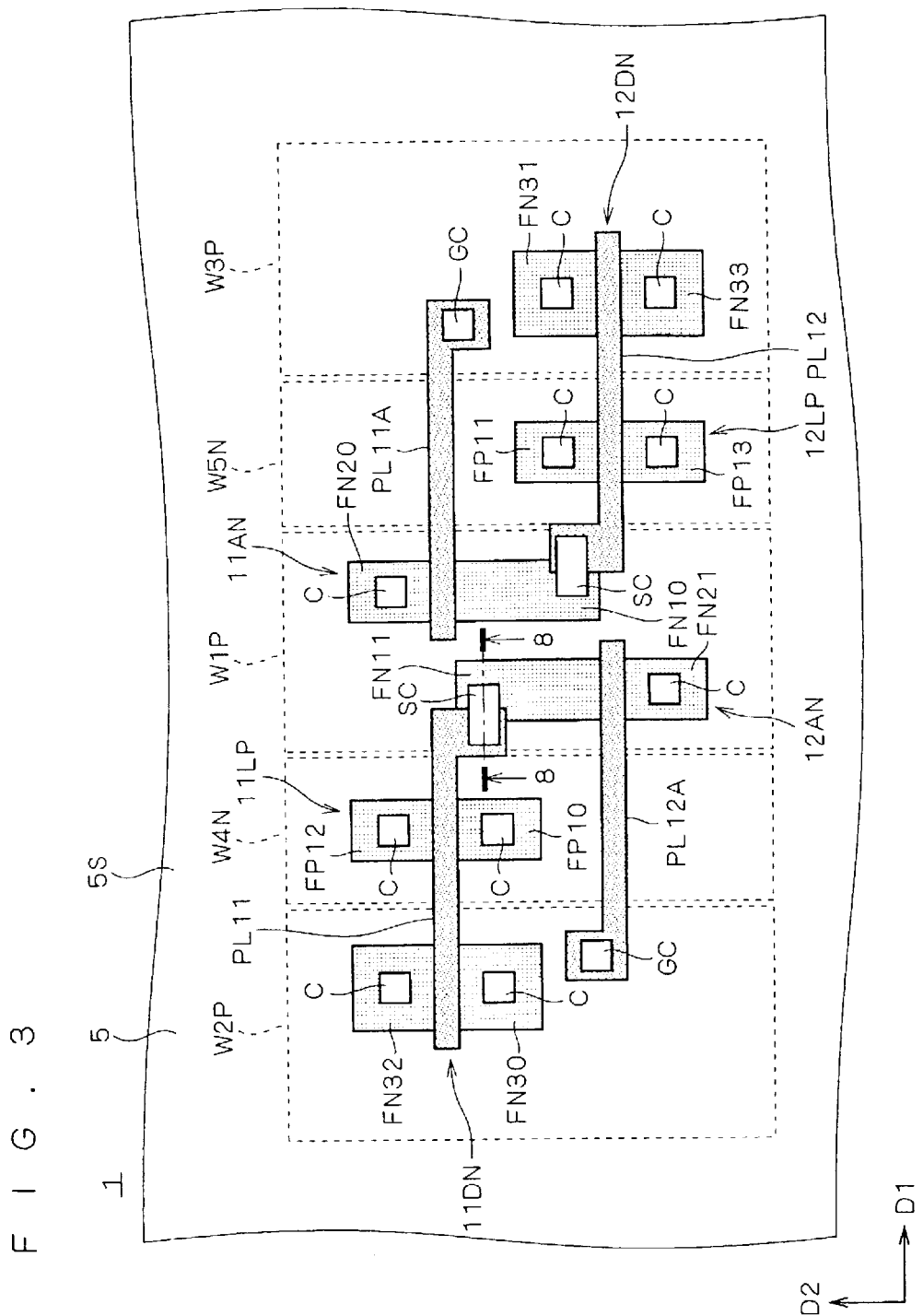
F I G . 3

F I G . 1 0
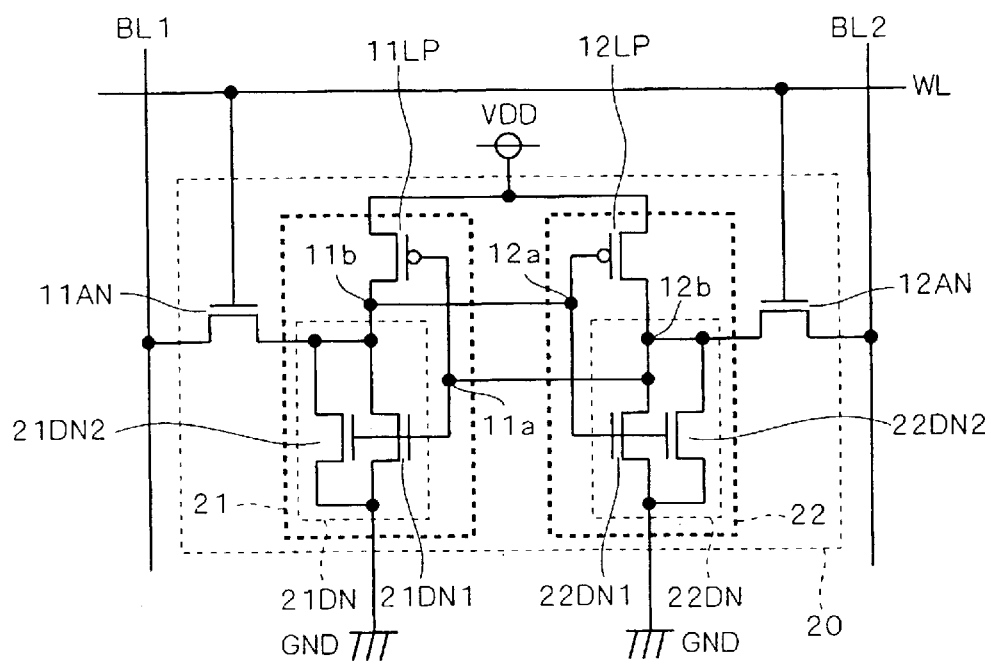

SEMICONDUCTOR MEMORY HAVING ACCESS TRANSISTORS FORMED IN A SINGLE WELL AND DRIVER TRANSISTORS FORMED IN WELLS DIFFERENT FROM THE SINGLE WELL

BACKGROUND OF THE INVENTION

1. Field of the Invention

The present invention relates to a semiconductor memory, and more particularly to an improvement in soft error immunity.

2. Description of the Background Art

FIG. 16 is a circuit diagram showing a conventional semiconductor memory 1R. FIG. 16 illustrates a memory cell 10R and accompanying two (i.e., a pair of) bit lines BL1R, BL2R and a word line WLR. The memory cell 10R is a memory cell of a so-called single port SRAM (Static Random Access Memory).

As shown in FIG. 16, the memory cell 10R is formed by two driver transistors 11DNR, 12DNR, two load transistors 11LPR, 12LPR, and two access transistors 11ANR, 12ANR. Access transistors may be called transfer transistors or transfer gates. In the conventional semiconductor memory 1R, the driver transistors 11DNR, 12DNR and access transistors 11ANR, 12ANR are each composed of an N-type (N-channel type) MOSFET (Metal-Oxide-Semiconductor Field Effect Transistor), while the load transistors 11LPR, 12LPR are each composed of a P-type (P-channel type) MOSFET.

The driver transistor 11DNR and load transistor 11LPR are connected in series to form a CMOS type inverter 11R. Likewise, the driver transistor 12DNR and load transistor 12LPR are connected in series to form a CMOS type inverter 12R. The two inverters 11R and 12R are connected in parallel between a power supply potential VDD and a ground potential GND.

A connection point 11bR between the driver transistor 11DNR and load transistor 11LPR, i.e., an output terminal 11bR of the inverter 11R is connected to the bit line BL1R through the access transistor 11ANR. Further, the output terminal 11bR of the inverter 11R is connected to an input terminal 12aR of the inverter 12R, that is, connected in common to the gates of the two transistors 12DNR and 12LPR. Likewise, a connection point 12bR between the driver transistor 12DNR and load transistor 12LPR, i.e., an output terminal 12bR of the inverter 12R is connected to the bit line BL2R through the access transistor 12ANR. Further, the output terminal 12bR of the inverter 12R is connected to an input terminal 11aR of the inverter 11R, that is, connected in common to the gates of the two transistors 11DNR and 11LPR. The gates of the access transistors 11ANR and 12ANR are both connected to the word line WLR.

Since the output terminals 11bR and 12bR of the inverters 11R and 12R correspond to so-called storage nodes of the memory cell 10R, these storage nodes are designated by the same reference characters 11bR and 12bR as the output terminals 11bR and 12bR for convenience's sake.

Next, a specific structure of the conventional semiconductor memory 1R will be described referring to layout views (plan views) shown in FIGS. 17 to 21. For ease of description, part of components of the conventional semiconductor memory 1R shown in FIG. 17 is extracted and shown in FIGS. 18 to 21. Further, for ease of description, first and second directions D1 and D2 are indicated as being parallel to a main surface 5SR of a semiconductor substrate 5R and perpendicular to each other.

As shown in FIGS. 17 to 21, three wells WP1R, WNR and WP2R are formed in the main surface 5SR of the semiconductor substrate 5R and are aligned in this order in the first direction D1.

As shown in FIG. 18, an N-type driver transistor 11DNR and an N-type access transistor 11ANR are formed in the well WP1R of P-type. P-type load transistors 11LPR, 12LPR are formed in the well WNR of N-type. Further, an N-type driver transistor 12DNR and an N-type access transistor 12ANR are formed in the well WP2R of P-type.

Specifically, $N^+$-type impurity regions FN32R, FN10R and FN20R constituting source/drain regions of N-type MOSFETs are formed in the main surface 5SR in the P-well WP1R. The impurity regions FN32R and FN10R are aligned in the second direction D2 with a channel region of the driver transistor 11DNR interposed therebetween, and the impurity regions FN10R and FN20R are aligned in the second direction D2 with a channel region of the access transistor 11ANR interposed therebetween. Here, the two transistors 11DNR and 11ANR share the impurity region FN10R.

Likewise, $N^+$-type impurity regions FN33R, FN11R and FN21R are formed in the main surface 5SR in the P-well WP2R. The impurity regions FN33R and FN11R are aligned in the second direction D2 with a channel region of the driver transistor 12DNR interposed therebetween, and the impurity regions FN11R and FN21R are aligned in the second direction D2 with a channel region of the access transistor 12ANR interposed therebetween. Here, the two transistors 12DNR and 12ANR share the impurity region FN11R.

On the other hand, $P^+$-type impurity regions FP12R, FP10R, FP13R and FP11R constituting source/drain regions of P-type MOSFETs are formed in the main surface 5SR in the P-well WP2R. The impurity regions FP12R and FP10R are aligned in the second direction D2 with a channel region of the load transistor 11LPR interposed therebetween, and the impurity regions FP13R and FP11R are aligned in the second direction D2 with a channel region of the load transistor 12LPR interposed therebetween.

The channel regions of the transistors 11DNR, 11LPR and 12ANR are aligned in the first direction D1, and the channel regions of the transistors 12DNR, 12LPR and 11ANR are aligned in the first direction D1.

A gate interconnect line PL11R is provided to be opposite to the channel regions of the transistors 11DNR and 11LPR with a gate oxide film (not shown) interposed therebetween. Further, the gate interconnect line PL11R is in contact with the impurity region FP11R. Likewise, a gate interconnect line PL12R is provided to be opposite to the channel regions of the transistors 12DNR and 12LPR with a gate oxide film (not shown) interposed therebetween. Further, the gate interconnect line PL12R is in contact with the impurity region FP10R. Likewise, gate interconnect lines PL11AR and PL12AR are provided to be opposite to the channel regions of the access transistors 11ANR and 12ANR, respectively, with a gate oxide film (not shown) interposed therebetween. The gate interconnect lines PL11R, PL12R, PL11AR and PL12AR are made of, e.g., low resistance polysilicon.

An interlayer insulation film (not shown) is provided to cover the impurity region FN32R and the like and the gate interconnect lines PL11R, PL12R, PL11AR and PL12AR. Contact holes CR reaching the impurity regions FN32R, FN10R, FN20R, FN33R, FN11R, FN21R, FP12R and FP13R, respectively, are formed in the interlayer insulation film. Further, a contact hole (also referred to as shared contact hole) SCR, to the inside of which the gate interconnect line PL11R and impurity region FP11R are both exposed, and a shared contact hole SCR, to the inside of which the gate interconnect line PL12R and impurity region FP10R are both exposed, are formed in the interlayer insulation film. Moreover, contact holes (also referred to as gate contact holes) GCR reaching the gate interconnect lines PL11AR and PL12AR, respectively, are further formed in the interlayer insulation film.

Next, as will be appreciated from FIGS. 18 and 19, first layer interconnect lines 1WR, 1GR, 1DR, 1B1R, 1B2R, 1L1R and 1L2R made of, e.g., aluminum are provided on the interlayer insulation film.

The two interconnect lines 1WR are in contact with the gate interconnect lines PL11AR and PL12AR, respectively, through the gate contact holes GCR, while the two interconnect lines 1GR are in contact with the impurity regions FN32R and FN33R, respectively, through the contact holes CR. Further, the two interconnect lines 1DR are in contact with the impurity regions FP12R and FP13R, respectively, through the contact holes CR. Furthermore, the interconnect lines 1B1R and 1B2R are in contact with the impurity regions FN20R and FN21R, respectively, through the contact holes CR.

The interconnect line 1L1R is in contact with the impurity regions FN10R, FP10R and the gate interconnect line PL12R through the contact hole CR and shared contact hole SCR. Likewise, the interconnect line 1L2R is in contact with the impurity regions FN11R, FP11R and the gate interconnect line PL11R through the contact hole CR and shared contact hole SCR.

An interlayer insulation film (not shown) is provided to cover these interconnect lines 1WR, 1GR, 1DR, 1B1R, 1B2R, 1L1R and 1L2R. The interlayer insulation film is provided with via holes 1TR, which are provided on the interconnect lines 1WR, 1GR, 1DR, 1B1R and 1B2R.

Next, as will be appreciated from FIGS. 19 and 20, second layer interconnect lines 2WR, 2GR, 2DR, 2B1R and 2B2R made of, e.g., aluminum are provided on the interlayer insulation film (not shown) covering the first layer interconnect lines 1WR, 1GR, 1DR, 1B1R, 1B2R, 1L1R and 1L2R. The interconnect lines 2WR, 2GR, 2B1R and 2B2R are in contact with the interconnect lines 1WR, 1GR, 1DR, 1B1R and 1B2R, respectively, through the via holes 1TR, while the interconnect line 2DR is in contact with the two interconnect lines 1DR through the via holes 1TR.

An interlayer insulation film (not shown) is provided to cover these interconnect lines 2WR, 2GR, 2DR, 2B1R and 2B2R. The interlayer insulation film is provided with via holes 2TR, which are provided on the two interconnect lines 2WR, respectively.

Further, as will be appreciated from FIGS. 20 and 21, a third layer interconnect line 3WR made of, e.g., aluminum is provided on the interlayer insulation film (not shown) covering the second layer interconnect lines 2WR, 2GR, 2DR, 2B1R and 2B2R. The interconnect line 3WR is in contact with the two interconnect lines 2WR through the via holes 2TR.

The interconnect lines 2B1R and 2B2R correspond to the bit lines BL1R and BL2R, respectively, and the interconnect line 3WR corresponds to the word line WLR. The interconnect lines 2GR are connected to the ground potential GND, and the interconnect line 2DR is connected to the power supply potential VDD.

In the conventional semiconductor memory 1R having the above-described structure, the storage node 11bR is formed to include the impurity regions FN10R and FP10R, and the storage node 12bR is formed to include the impurity regions FN11R and FP11R. Thus, soft errors occur when α-rays or neutrons are made incident to these impurity regions FN10R, FP10R, FN11R and FP11R. Particularly, the $N^+$-type impurity region FN10R which belongs to the driver transistor 11DNR and access transistor 11ANR formed in the same well WP1R and the $N^+$-type impurity region FN11R which belongs to the driver transistor 12DNR and access transistor 12ANR formed in the same well WP2R are greatly responsible for the occurrence of soft errors. Since the soft error immunity of the conventional semiconductor memory 1R is determined only by the capacity of the storage nodes 11bR and 12bR, a decrease in the capacity of the storage nodes 11bR and 12bR with miniaturization causes deterioration in the soft error immunity.

SUMMARY OF THE INVENTION

An object of the present invention is to provide a semiconductor memory with improved soft error immunity as compared to the conventional semiconductor memory 1R.

According to the present invention, a semiconductor memory includes a semiconductor substrate and a memory cell formed in the semiconductor substrate. The memory cell includes first and second inverters and first and second access transistors. The first inverter has a first input terminal and a first output terminal. The first inverter further has at least one MISFET of a first conductivity type as a first driver transistor. The at least one MISFET has a main terminal connected to the first output terminal. The second inverter has a second input terminal connected to the first output terminal and a second output terminal connected to the first input terminal. The second inverter further has at least one MISFET of the first conductivity type as a second driver transistor. The at least one MISFET has a main terminal connected to the second output terminal. The first access transistor is formed by a MISFET of the first conductivity type having a main terminal connected to the first output terminal. The second access transistor is formed by a MISFET of the first conductivity type having a main terminal connected to the second output terminal. The semiconductor substrate includes first to third wells of a second conductivity type opposite to the first conductivity type. The first to third wells are not in contact with one another. The first and second access transistors are both formed in the first well. The first driver transistor is formed in the second well. The second driver transistor is formed in the third well.

Since the first and second access transistors are both formed in the first well, impurity regions constituting the main terminals of the first and second access transistors are both formed in the first well. Thus, the effect of common mode noise can improve the soft error immunity. Further, the impurity regions of the first and second access transistors are formed in the first well, while those of the first and second driver transistors are formed in the second and third wells, respectively, that are not in contact with the first well. Thus, the soft error immunity can be improved as compared to the structure in which access transistors and driver transistors are formed in the same well.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram showing a semiconductor memory according to a first preferred embodiment of the present invention;

FIGS. 2 through 7 are layout views showing the semiconductor memory according to the first preferred embodiment;

FIG. 10 is a circuit diagram showing a semiconductor memory according to a second preferred embodiment of the present invention;

DESCRIPTION OF THE PREFERRED EMBODIMENTS

First Preferred Embodiment

Figure 2:
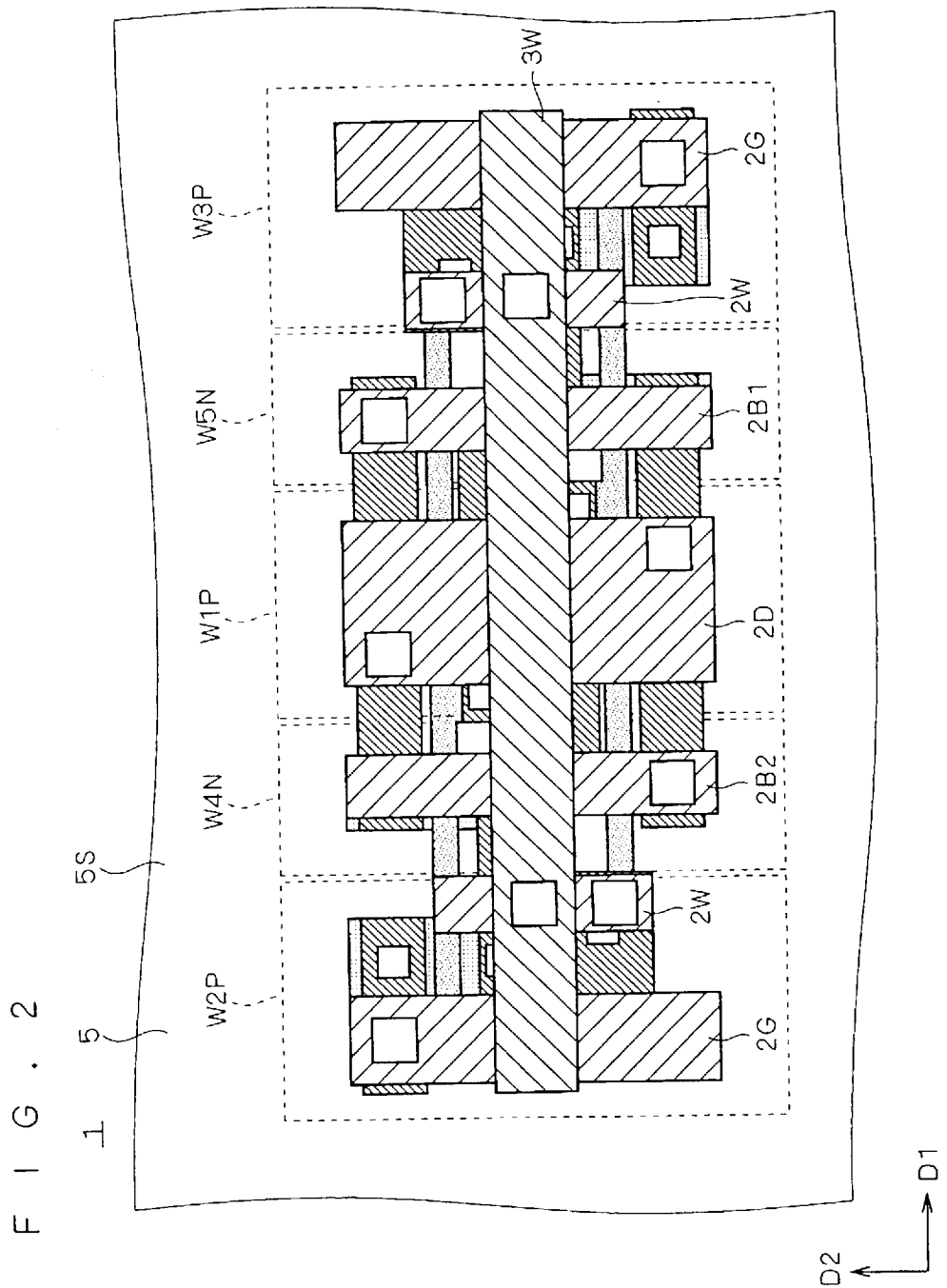

FIG. 1 is a circuit diagram showing a semiconductor memory 1 according to a first preferred embodiment of the present invention. Although FIG. 1 illustrates a memory cell 10 and accompanying two (i.e., a pair of) bit lines BL1 and BL2 and a word line WL, the semiconductor memory 1 includes a plurality of memory cells 10, a plurality of bit lines BL1, BL2 and a plurality of word lines WL. Hereinafter, a memory cell of a so-called single port SRAM (Static Random Access Memory) will be described as an example of a memory cell 10.

As shown in FIG. 1, the memory cell 10 is formed by first and second driver transistors 11DN, 12DN, first and second load transistors 11LP, 12LP, and first and second access transistors 11AN, 12AN. Access transistors may be called transfer transistors or transfer gates. Description will be directed to the case where these six transistors 11DN, 12DN, 11LP, 12LP, 11AN and 12AN in the semiconductor memory 1 are each composed of a single field effect transistor (FET), more specifically, where the driver transistors 11DN, 12DN and the access transistors 11AN, 12AN are each composed of an N-type (N-channel type) MOSFET (Metal-Oxide-Semiconductor FET) and the load transistors 11LP, 12LP are each composed of a P-type (P-channel type) MOSFET. FETs of general MIS (Metal-Insulator-Semiconductor) type are also applicable in place of those of MOS type.

The first driver transistor 11DN and first load transistor 11LP are connected in series to form a first CMOS type inverter 11. Likewise, the second driver transistor 12DN and second load transistor 12LP are connected in series to form a second CMOS type inverter 12. The two inverters 11 and 12 are connected in parallel between the power supply potential VDD and ground potential GND.

More specifically, the sources of the respective load transistors 11LP and 12LP are connected to the power supply potential VDD, and the drains of the respective load transistors 11LP and 12LP are connected to the drains of the driver transistors 11DN and 12DN, respectively, and the sources of the respective driver transistors 11DN and 12DN are connected to the ground potential GND. The gates of the respective driver transistors 11DN and 12DN are connected to the gates of the load transistors 11LP and 12LP, respectively.

In each transistor (MISFET), the source-drain current path, specifically, a channel region (or channel forming region) CH which will be described later forms a main path, and the source and drain may each be called a main terminal. The gate is also called a control terminal.

A connection point 11b between the first driver transistor 11DN and first load transistor 11LP, i.e., an output terminal (or first output terminal) 11b of the first inverter 11 is connected to one of main terminals of the access transistor 11AN, while the other of the main terminals of the access transistors 11AN is connected to the first bit line BL1. Further, the output terminal 11b of the first inverter 11 is connected to an input terminal (or second input terminal) 12a of the second inverter 12, that is, connected in common to the gates of the two transistors 12DN and 12LP.

Likewise, a connection point 12b between the second driver transistor 12DN and second load transistor 12LP, i.e., an output terminal (or second output terminal) 12b of the second inverter 12 is connected to the bit line BL2 through the second access transistor 12AN. Further, the output terminal 12b of the second inverter 12 is connected to an input terminal (or first input terminal) 11a of the first inverter 11.

The gates of the first and second access transistors 11AN and 12AN are both connected to the word line WL.

Since the output terminals 11b and 12b of the inverters 11 and 12 correspond to so-called storage nodes of the memory cell 10, these storage nodes are designated by the same reference characters 11b and 12b as the output terminals 11b and 12b for convenience's sake. The storage nodes 11b and 12b will be described later in detail.

Figure 4:
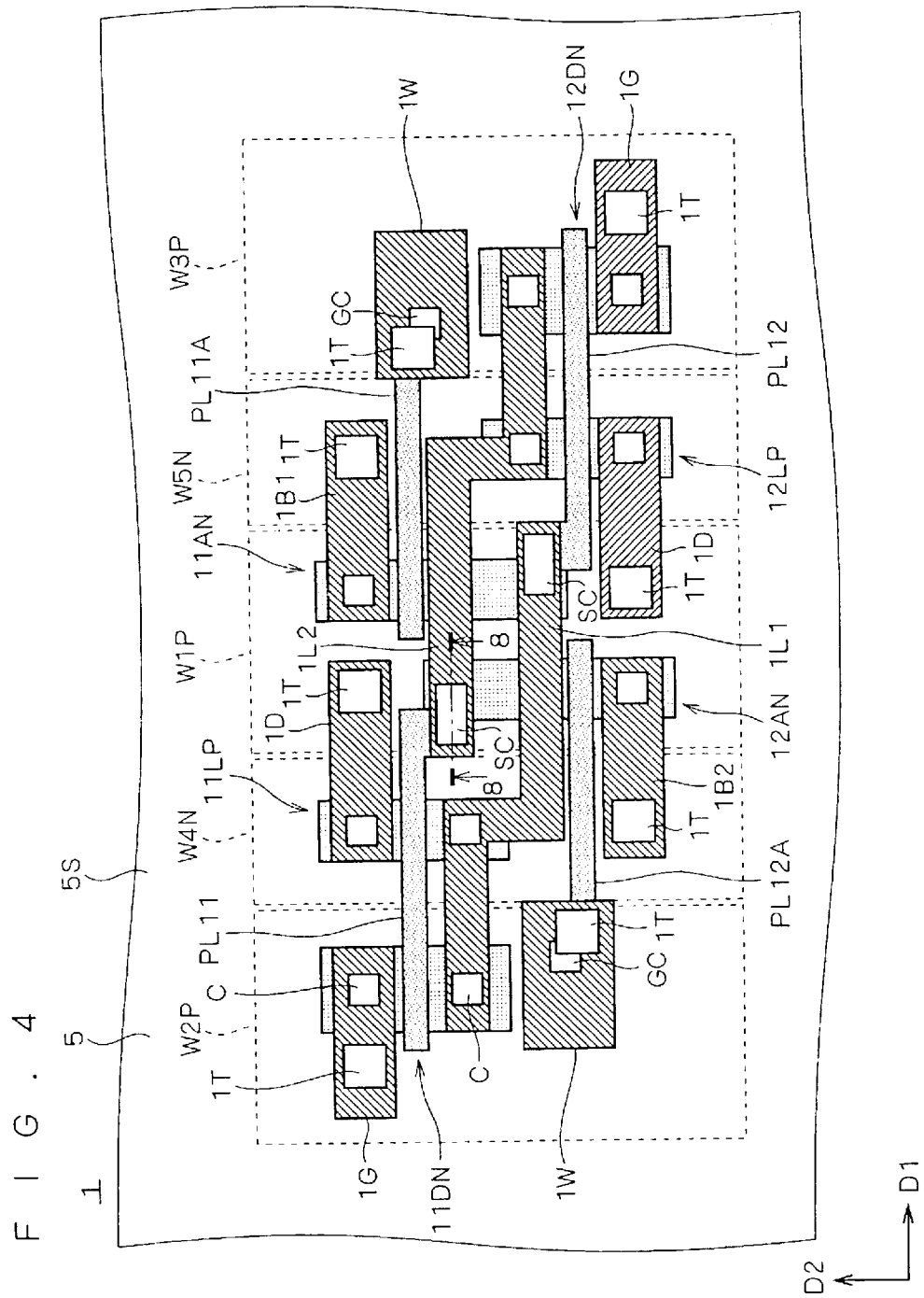

Next, a specific structure of the semiconductor memory 1 will be described referring to layout views (plan views) shown in FIGS. 2 to 7 and a sectional view shown in FIG. 8. For ease of description, part of components of the semiconductor memory 1 shown in FIG. 2 is extracted and shown in FIGS. 3 to 7, and a sectional view taken along the line 8—8 in FIGS. 3 and 4 is shown in FIG. 8. Further, for ease of description, first and second directions D1 and D2 are indicated as being parallel to a main surface 5S of a semiconductor substrate 5 and perpendicular to each other.

As shown in FIGS. 2 to 6, five wells W2P, W4N, W1P, W5N and W3P are formed in the main surface 5S of the semiconductor substrate 5 made of, e.g., silicon and are aligned in this order in the first direction D1. The first to third wells W1P, W2P and W3P are of P-type while the fourth and fifth wells W4N and W5N are of N-type. Here, The fourth N-well W4N is provided between the first and second P-wells W1P and W2P and the fifth N-well W5N is provided between the first and third P-wells W1P and W3P. In this way, the wells are provided such that the wells of the same conductivity type are not in contact with each other and such that the wells of different conductivity types are provided alternately. This can ensure electric isolation between the respective wells W1P, W2P, W3P, W4N and W5N.

Further, as shown in FIG. 3, both of the first and second N-type access transistors 11AN and 12AN are formed in the first P-well W1P. The first N-type driver transistor 11DN is formed in the second P-well W2P, and the second N-type transistor 12DN is formed in the third P-well W3P. Moreover, the first P-type load transistor 11LP is formed in the fourth N-well W4N, while the second P-type load transistor 12LP is formed in the fifth N-well W5N. The respective transistors 11DN, 11LP, 11AN, 12DN, 12LP and 12AN are isolated from each other by element isolation 6 (cf. FIG. 8), e.g., LOCOS or trench type element isolation.

Specifically, $N^+$-type impurity regions FN10, FN20, FN11 and FN21 constituting the main terminals of N-type MOSFETs are formed in the main surface 5S in the first P-well W1P. Impurity regions designated by reference characters starting from "FN" should be construed as N⁺-type in the following description.

More specifically, the two impurity regions FN10 and FN20 of the first access transistor 11AN are aligned in the second direction D2 with a channel region of the transistor 11AN interposed therebetween, and the two impurity regions FN11 and FN21 of the second access transistor 12AN are aligned in the second direction D2 with a channel region of the transistor 12AN interposed therebetween.

The impurity regions FN10 and FN20 of the first access transistor 11AN are provided closer to the fifth well W5N than the impurity regions FN11 and FN21 of the second access transistor 12AN. The impurity regions FN10 and FN11 are aligned in the first direction D1, while the impurity regions FN20 and FN21 are not aligned in the first direction D1.

Two impurity regions FN30 and FN32 of the first driver transistor 11DN are formed in the main surface 5S in the second P-well W2P, which are aligned in the second direction D2 with the channel region CH of the transistor 11DN interposed therebetween.

Likewise, two impurity regions FN31 and FN33 of the second driver transistor 12DN are formed in the main surface 5S in the third P-well W3P, which are aligned in the second direction D2 with the channel region CH of the transistor 12DN interposed therebetween.

Further, two P⁺-type impurity regions FP10 and FP12 constituting the main terminals of the first P-type load transistor 11LP are formed in the main surface 5S in the fourth N-well W4N, which are aligned in the second direction D2 with the channel region CH of the transistor 11LP interposed therebetween. Impurity regions designated by reference characters starting from "FP" should be construed as P⁺-type in the following description.

Likewise, impurity regions FP11 and FP13 of the second P-type load transistor 12LP are formed in the main surface 5S in the fifth N-well W5N, which are aligned in the second direction D2 with the channel region CH of the transistor 12LP interposed therebetween.

Here, the impurity regions FN32, FN30, FP12, FP10, FN20 and FN10 are provided such that the channel regions CH of the first driver transistor 11DN, first load transistor 11LP and first access transistor 11AN are aligned in the first direction D1. Further, the impurity regions FN31, FN33, FP11, FP13, FN11 and FN21 are provided such that the channel regions CH of the second driver transistor 12DN, second load transistor 12LP and second access transistor 12AN are aligned in the first direction D1.

The impurity regions FN32, FP12 and FN20 are aligned in the first direction D1, while the impurity regions FN33, FP13 and FN21 are aligned in the first direction D1. Further, the impurity regions FN30, FP10, FN11, FN10, FP11 and FN31 are aligned in the first direction D1.

As shown in FIG. 3, a gate interconnect line (or first gate interconnect line) PL11 extends in the first direction D1 above the wells W2P, W4N and W1P in the plan view. Here, the gate interconnect line PL11 is provided to be opposite to the channel regions CH of both the first driver transistor 11DN and first load transistor 11LP with a gate oxide film (not shown) interposed therebetween. Portions of the gate interconnect line PL11 opposite to the channel regions CH correspond to the gates G of the respective transistors 11DN and 11LP (cf. FIG. 7).

Figure 7:
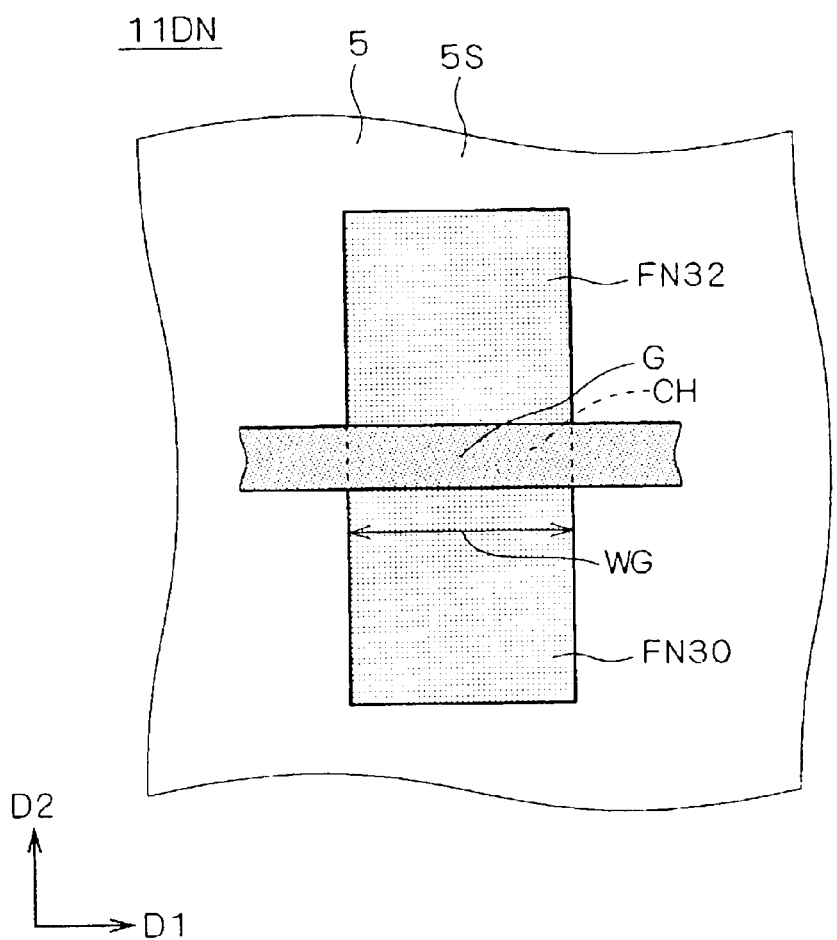
Figure 8:
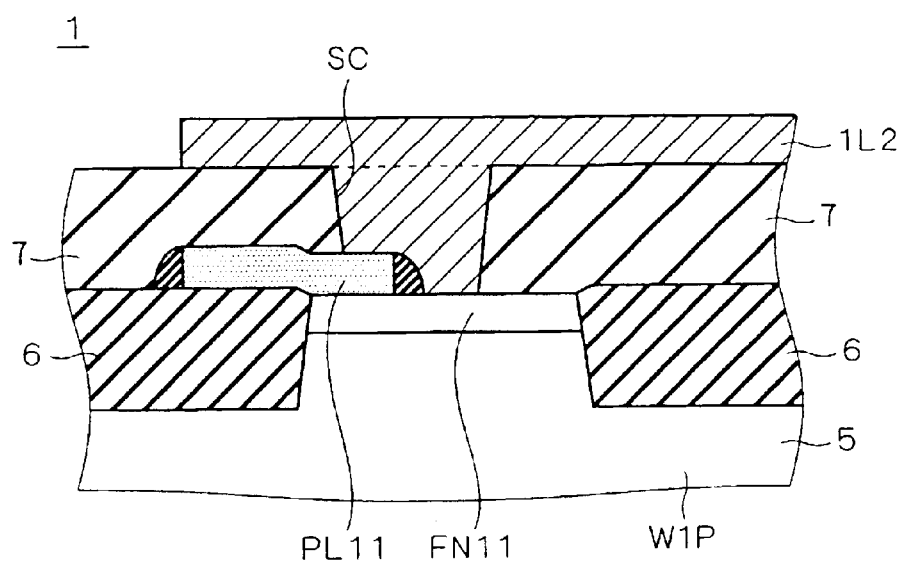
FIG. 8 is a sectional view showing the semiconductor memory according to the first preferred embodiment.

Here, the gate G of the first driver transistor 11DN illustrated in FIG. 7 has a gate width WG in the first direction D1 that corresponds to the channel width. The same applies to the other transistors 11LP, 11AN, 12DN, 12LP and 12AN.

Referring back to FIG. 3, the gate interconnect line PL11 turns to the second direction D2 on the first well W1P and comes into contact with the impurity region FN11 of the second access transistor 12AN (cf. FIG. 8). The gate interconnect line PL11 is provided on the element isolation 6 except the above-described portions. The gates G of the first driver transistor 11DN and first load transistor 11LP are both connected in common with such gate interconnect line PL11 and are connected to one of the main terminals of the second access transistor 12AN (cf. FIG. 1).

Likewise, in the plan view, a gate interconnect line (or second gate interconnect line) PL12 extends in the first direction D1 above the wells W3P, W5N and W1P and is opposite to the channel regions CH of both the second driver transistor 12DN and second load transistor 12LP with a gate oxide film (not shown) interposed therebetween. Further, the gate interconnect line PL12 is in contact with the impurity region FN10 of the first access transistor 11AN. The gates G of the second driver transistor 12DN and second load transistor 12LP are both connected in common with such gate interconnect line PL12 and are connected to one of the main terminals of the first access transistor 11AN (cf. FIG. 1).

Further, in the plan view, a gate interconnect line PL11A extends in the first direction D1 above the wells W1P, W5N and W3P and is opposite to the channel regions CH of the first access transistor 11AN with a gate oxide film (not shown) interposed therebetween. Likewise, in the plan view, a gate interconnect line PL12A extends in the first direction D1 above the wells W1P, W4N and W2P and is opposite to the channel regions CH of the second access transistor 12AN with a gate oxide film (not shown) interposed therebetween.

Here, the two gate interconnect lines PL11 and PL11A are aligned linearly as a whole, and the two gate interconnect lines PL12 and PL12A are also aligned linearly as a whole. In other words, the gates G of the transistors 11DN, 11LP and 11AN are aligned in the first direction D1, while the gates G of the transistors 12DN, 12LP and 12AN are aligned in the first direction D1. The gates G of the two load transistors 11LP and 12LP are not aligned in the first direction D1.

The gate interconnect lines PL11, PL12, PL11A and PL12A are made of, e.g., low resistance polysilicon.

An interlayer insulation film 7 (cf. FIG. 8) is provided on the main surface 5S of the semiconductor substrate 5 to cover the impurity region FN32 and the like and the gate interconnect lines PL11, PL12, PL11A and PL12A. Contact holes C, SC and GC are formed in the interlayer insulation film 7. The contact holes C are provided on the impurity regions FN30, FN32, FP10, FP12, FN21, FN20, FP11, FP13, FN31 and FN33, respectively.

A contact hole (also referred to as shared contact hole) SC is provided on the vicinity of a contact region between the gate interconnect line PL11 and impurity region FN11 (cf. FIG. 8), and the gate interconnect line PL11 and impurity region FN11 are both exposed into the inside of the shared contact hole SC. Likewise, a shared contact hole SC is provided such that the gate interconnect line PL12 and impurity region FN10 are both exposed into the inside of the shared contact hole SC.

Contact holes (also referred to as gate contact holes) GC are provided on the gate interconnect lines PL11A and PL12A, respectively, in the plan view. The gate contact holes GC are provided on the wells W2P and W3P, respectively.

As will be appreciated from FIGS. 3, 4 and 8, first layer interconnect lines 1G, 1W, 1D, 1B1, 1B2, 1L1 and 1L2 made of, e.g., aluminum are provided on the interlayer insulation film 7. An interlayer insulation film (not shown) is provided to cover these interconnect lines 1G, 1W, 1D, 1B1, 1B2, 1L1 and 1L2 and is provided with via holes 1T.

Specifically, the two interconnect lines 1G extend in the first direction D1 above the wells W2P and W3P, respectively, in the plan view. One of the interconnect lines 1G is in contact with the impurity region FN32 through a contact hole C, while the other of the interconnect lines 1G is in contact with the impurity region FN33 through a contact hole C. The via holes 1T are provided on the interconnect lines 1G, respectively.

The two interconnect lines 1W extends in the first direction D1 above the wells W2P and W3P, respectively, in the plan view. The one of the interconnect lines 1W is in contact with the gate interconnect line PL11A through a gate contact hole GC, while the other of the interconnect lines 1W is in contact with the gate interconnect line PL12A through a gate contact hole GC. The via holes 1T are provided on the interconnect lines 1W, respectively. The via holes 1T on the interconnect lines 1W are arranged closer to the first well W1P than those on the interconnect lines 1G.

The two interconnect lines 1D extend in the first direction D1 above the wells W1P and W4N, and the wells W1P and W5N, respectively, in the plan view. The one of the interconnect lines 1D is in contact with the impurity region FP12 through a contact hole C, while the other of the interconnect lines 1D is in contact with the impurity region FP13 through a contact hole C. The via holes 1T are formed on the interconnect lines 1D, respectively, and are provided on the well W1P in the plan view.

The interconnect line 1B1 extends in the first direction D1 above the wells W1P and W5N in the plan view and is in contact with the impurity region FN20 through a contact hole C. Likewise, the interconnect line 1B2 extends in the first direction D1 above the wells W1P and W4N in the plan view and is in contact with the impurity region FN21 through a contact hole C. The via holes 1T are formed on the interconnect lines 1B1 and 1B2, respectively, and are provided on the wells W5N and W4N, respectively, in the plan view.

The interconnect line (or first interconnect line) 1L1, in the plan view, extends in the first direction D1 from above the impurity region FN30 to reach above the impurity region FP10, and extends in the second direction D2 from above the impurity region FP10 toward the side of the gate interconnect line PL12A and extends again in the first direction D1 before reaching the gate interconnect line PL12A to reach the shared contact hole SC on the gate interconnect line PL12 and impurity region FN10. The interconnect line 1L1 is in contact with the impurity regions FN30, FP10, FN10 and gate interconnect line PL12 through contact holes (or first contact holes) C, SC. Here, the interconnect line 1L1 is in contact with both the gate interconnect line PL12 and impurity region FN10 through the shared contact hole (or first shared contact hole) SC (cf. FIG. 8). The impurity regions FN30, FP10 and FN10 correspond to the main terminals of the first driver transistor 11DN, first load transistor 11LP and first access transistor 11AN, each being connected to the output terminal 11b of the first inverter 11 (cf. FIG. 1).

Likewise, the interconnect line (or second interconnect line) 1L2 extends, in the plan view, in the first direction D1 from above the impurity region FN31 to reach above the impurity region FP11, and extends in the second direction D2 from above the impurity region FP11 toward the side of the gate interconnect line PL11A and extends again in the first direction D1 before reaching the gate interconnect line PL11A to reach the shared contact hole SC on the gate interconnect line PL11 and impurity region FN11. The interconnect line 1L2 is in contact with the impurity regions FN31, FP11, FN11 and gate interconnect line PL11 through contact holes (or second contact holes) C, SC. Here, the interconnect line 1L2 is in contact with both the gate interconnect line PL11 and impurity region FN11 through the shared contact hole (or second shared contact hole) SC (cf. FIG. 8). The impurity regions FN31, FP11 and FN11 correspond to the main terminals of the second driver transistor 12DN, second load transistor 12LP and second access transistor 12AN, each being connected to the output terminal 12b of the second inverter 12 (cf. FIG. 1).

Such shared contact holes SC can reduce the memory cell 10 in size.

Figure 5:
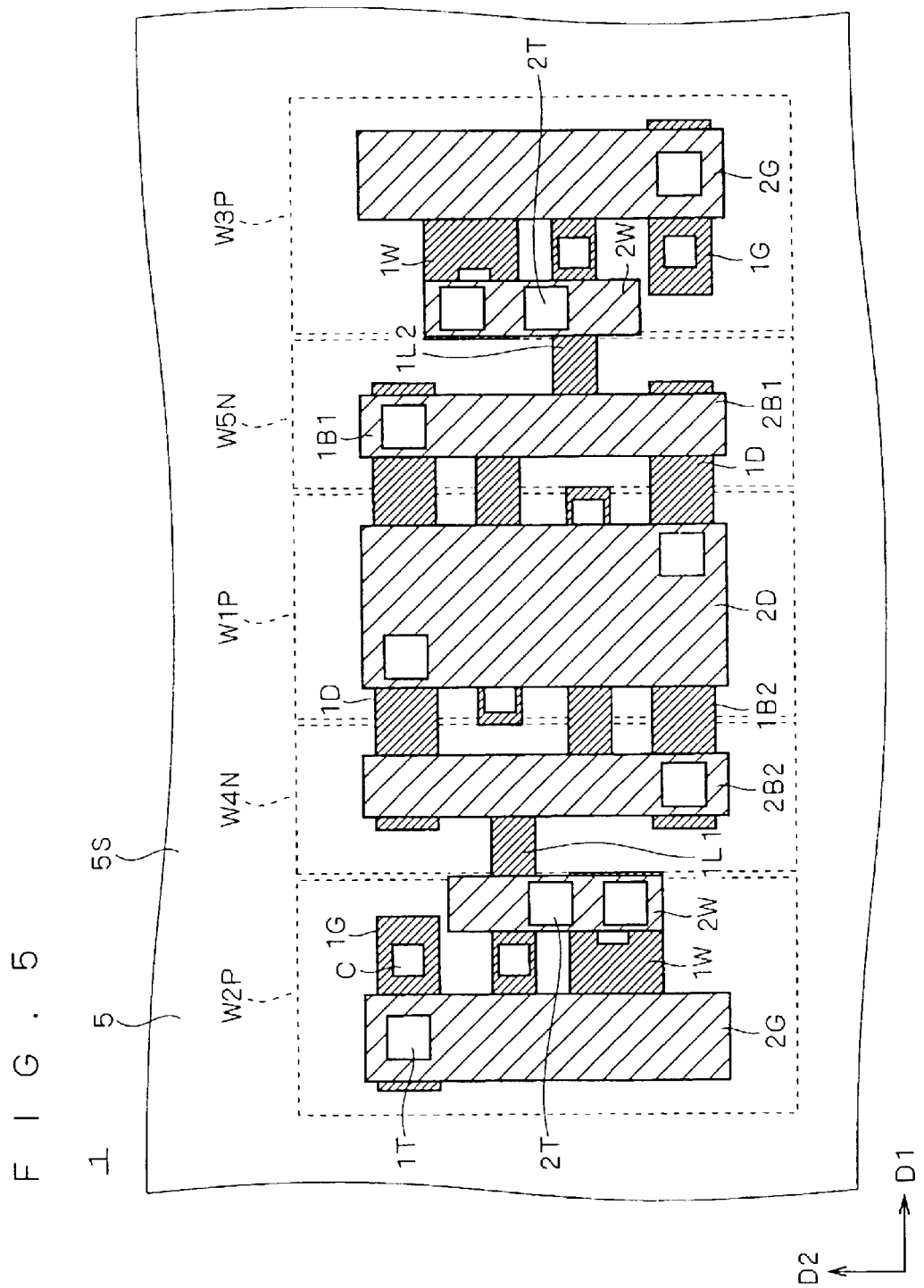

Next, as will be appreciated from FIGS. 4 and 5, second layer interconnect lines 2G, 2W, 2D, 2B1 and 2B2 made of, e.g., aluminum are provided on the interlayer insulation film (not shown) covering the first layer interconnect lines 1G, 1W, 1D, 1B1, 1B2, 1L1 and 1L2. An interlayer insulation film (not shown) is provided to cover these interconnect lines 2G, 2W, 2D, 2B1 and 2B2 and is provided with via holes 2T.

Specifically, the interconnect lines 2G extend in the second direction D2 above the wells W2P and W3P, respectively, in the plan view and are in contact with the interconnect lines 1G immediately below through the via holes 1T, respectively. Likewise, the interconnect lines 2W extend in the second direction D2 above the wells W2P and W3P, respectively, in the plan view and are in contact with the interconnect lines 1W immediately below through the via holes 1T, respectively. The via holes 2T are provided on the interconnect lines 2W, respectively, and are aligned in the first direction D1. The interconnect line 2D extends in the second direction D2 above the first well W1P in the plan view and is in contact with the two interconnect lines 1D through the via holes 1T.

The interconnect lines 2B1 and 2B2 extend in the second direction D2 above the wells W5N and W4N, respectively, in the plan view and are in contact with the interconnect lines 1B1 and 1B2 immediately below through the via holes 1T, respectively.

Figure 6:
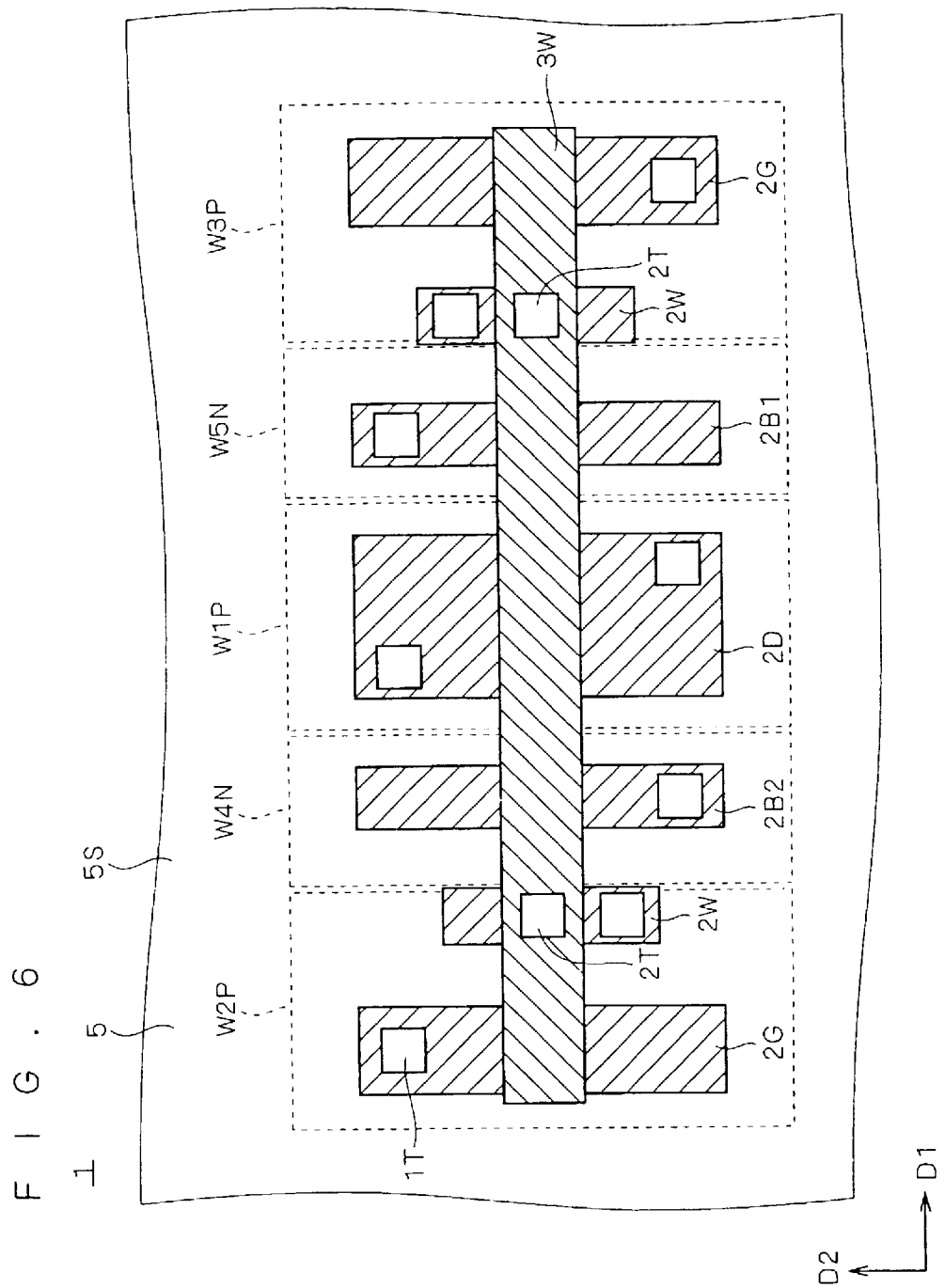

Further, as will be appreciated from FIGS. 5 and 6, a third layer interconnect line 3W made of, e.g., aluminum extends in the first direction D1 on the interlayer insulation film (not shown) covering the second layer interconnect lines 2W, 2G, 2D, 2B1 and 2B2. In the plan view, the interconnect line 3W extends over the via holes 2T and is in contact with the two interconnect lines 2W through the via holes 2T.

Two or more contact holes C may be provided to connect the impurity region FN32 and interconnect line 1G, for example. The same applies to the via holes 1T and 2T.

In the semiconductor memory 1 having such structure, the interconnect lines 2B1 and 2B2 correspond to the first and second bit lines BL1 and BL2, respectively, and the interconnect line 3W corresponds to the word line WL. The interconnect lines 2G are connected to the ground potential GND, and the interconnect line 2D is connected to the power supply potential VDD.

As described, the output terminals 11b and 12b of the inverters 11 and 12 correspond to the so-called storage nodes of the memory cell 10. Here, the storage nodes 11b and 12b are defined as portions having the same potential as the output terminals 11b and 12b and portions having substantially the same potential as the output terminals 11b and 12b which are connected with low impedance to the portions having the same potential as the output terminals 11b and 12b.

Specifically, in the semiconductor memory 1, the storage node 11b includes the interconnect line 1L1, impurity regions FN30, FP10, FN10 (corresponding to the main terminals of the transistors 11DN, 11LP and 11AN, each terminal being connected to the output terminal 11b of the inverter 11) and gate interconnect line PL12. Likewise, the storage node 12b includes the interconnect line 1L2, impurity regions FN31, FP11 and FN11 (corresponding to the main terminals of the transistors 12DN, 12LP and 12AN, each terminal being connected to the output terminal 12b of the inverter 12) and gate interconnect line PL11.

The semiconductor memory 1 achieves the following effects. First, since the first and second access transistors 11AN and 12AN are both formed in the first well W1P, the impurity regions FN10 and FN11 (constituting the storage nodes 11b and 12b, respectively) of the first and second access transistors 11AN and 12AN are both formed in the single well W1P. Thus, the effect of common mode noise can improve the soft error immunity. In other words, the influence of α-rays and the like incident to one of the impurity regions FN10 and FN11 can be distributed to the two transistors 11AN and 12AN, which allows the respective transistors 11AN and 12AN to receive less influence.

Further, since the impurity regions FN30, FP10 and FN10 constituting the storage node 11b are formed separately in the wells W2P, W4N and W1P electrically separated from each other, α-rays, even if made incident to any one of the impurity regions FN30, FP10 and FN10, will not cause any defect in the remainder of the impurity regions FN30, FP10 and FN10.

Figure 16:
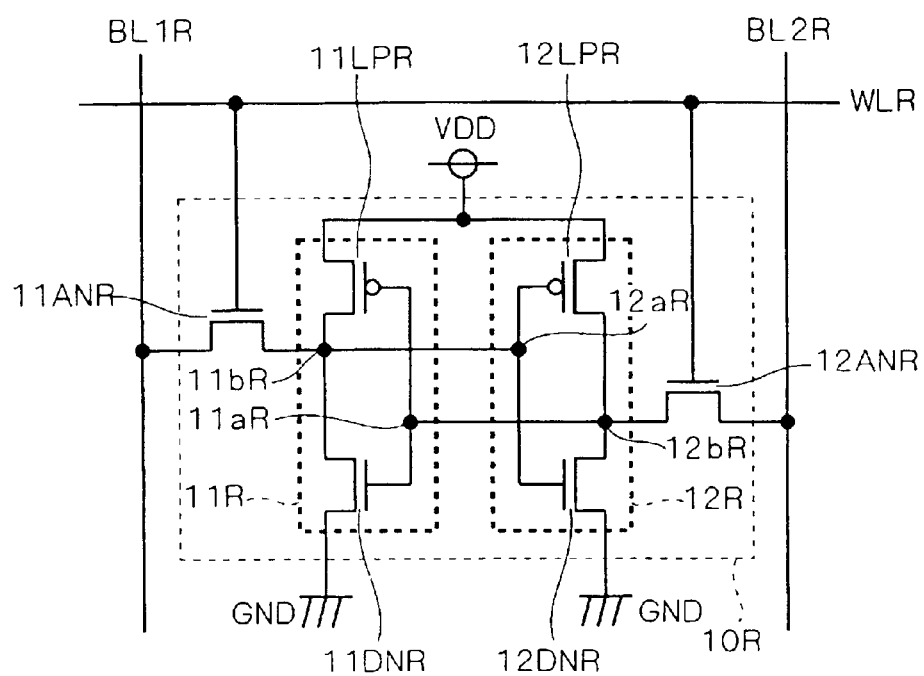
FIG. 16 is a circuit diagram showing a conventional semiconductor memory.
Figure 17:
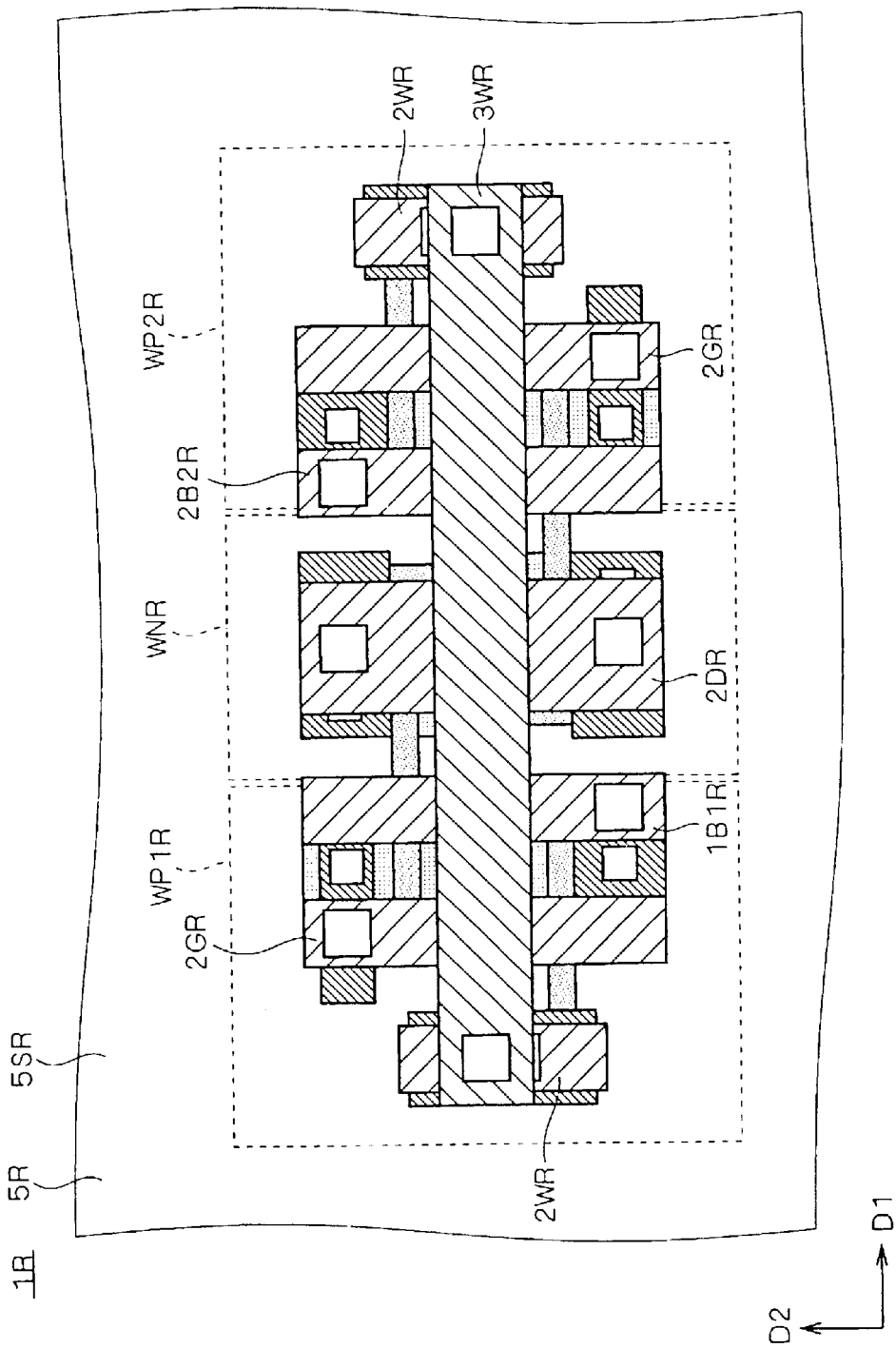
FIGS. 17 through 21 are layout views showing the conventional semiconductor memory.
Figure 18:
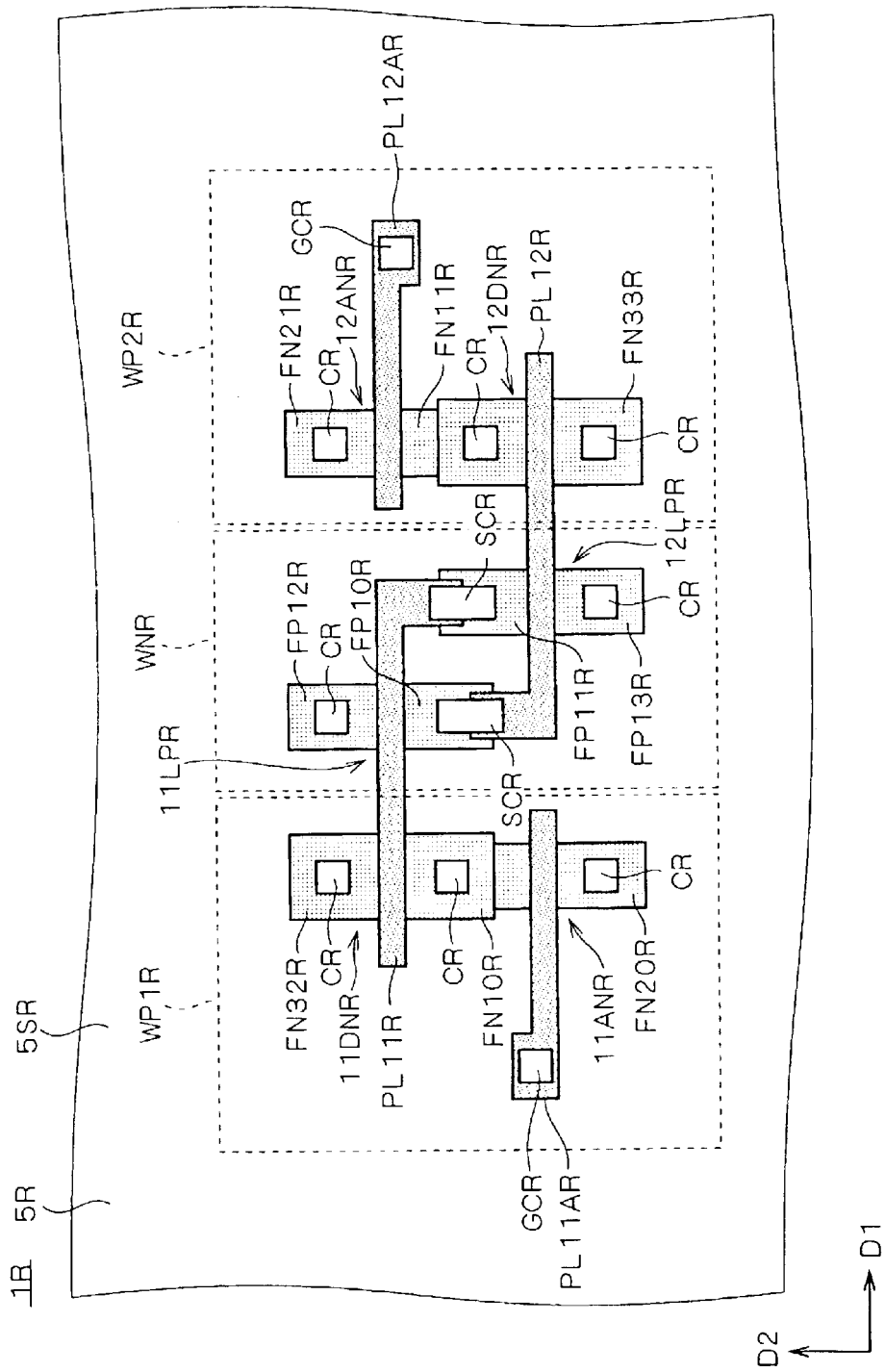
Figure 19:
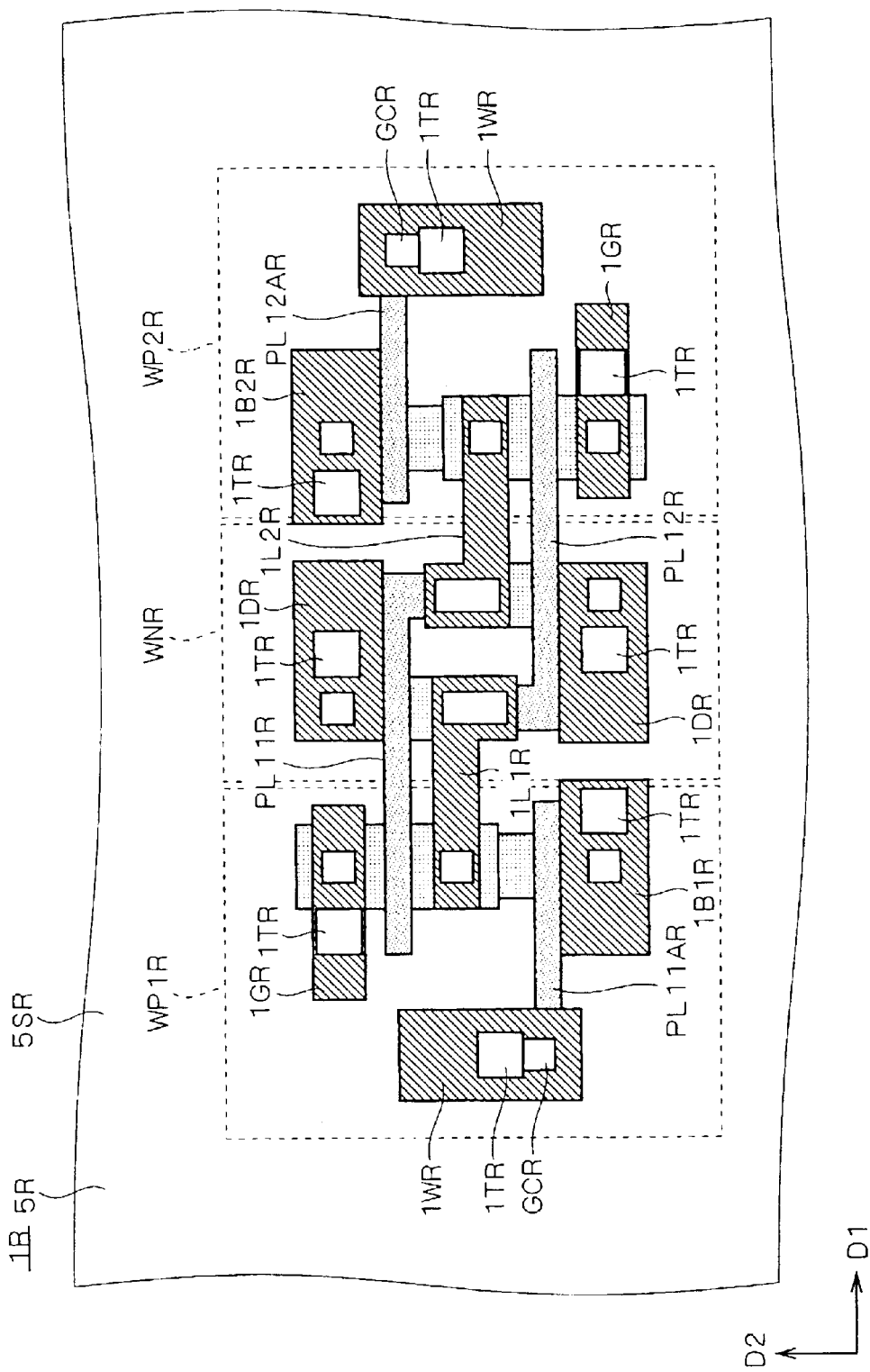
Figure 20:
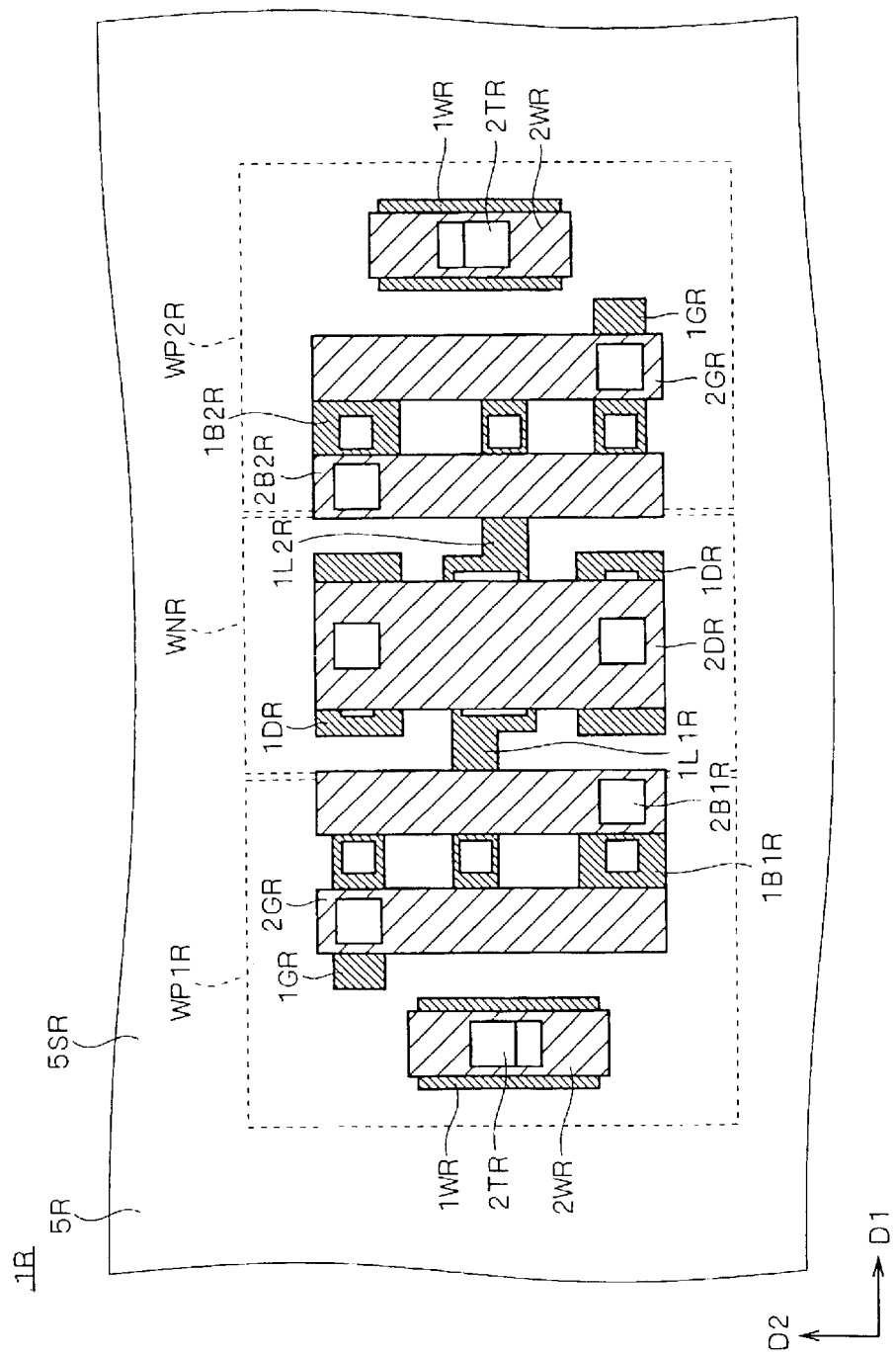
Figure 21:
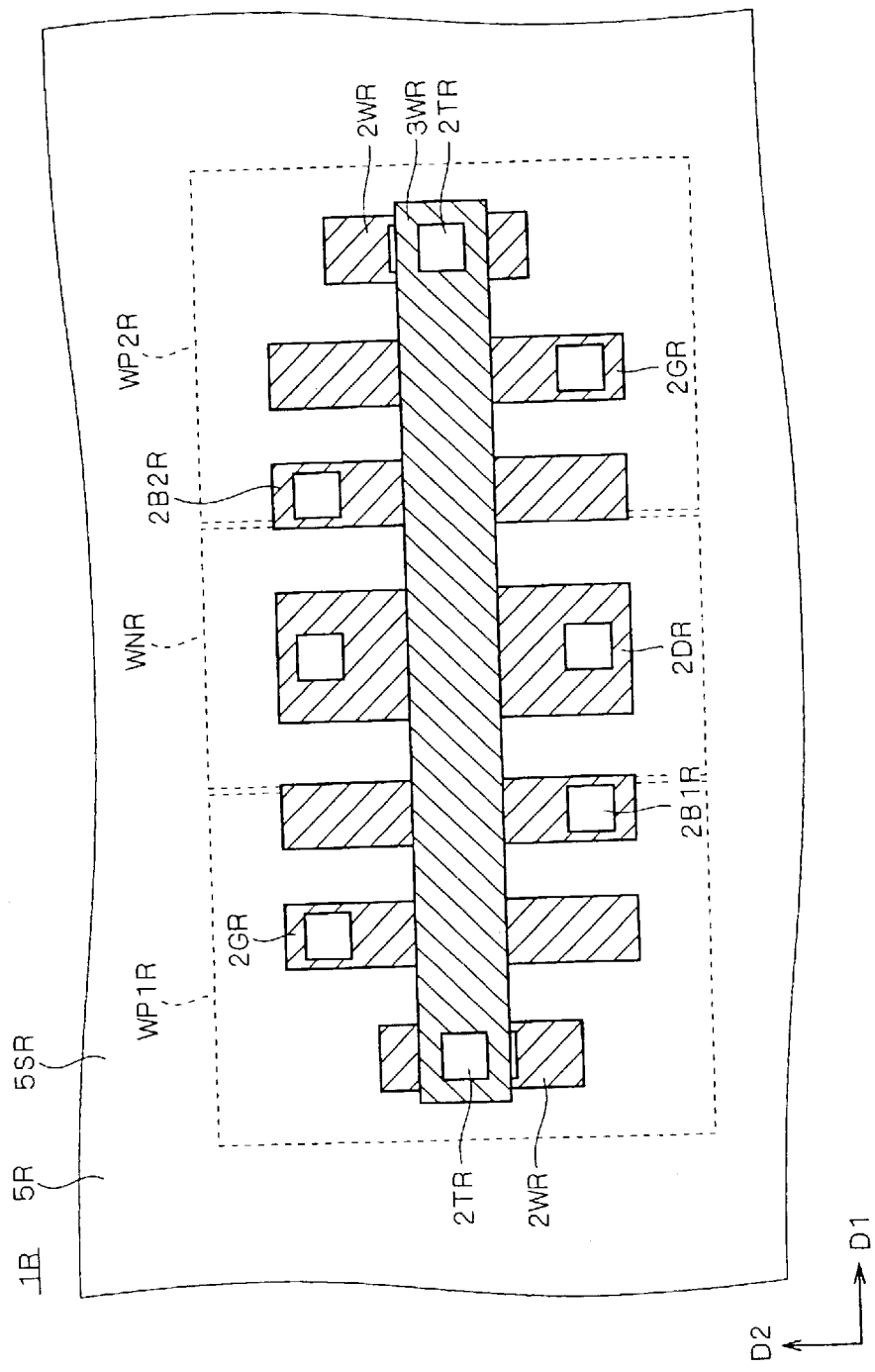

Referring back to the conventional semiconductor memory 1R (cf. FIGS. 16 and 18), the driver transistor 11DNR and access transistor 11ANR are formed in the single well WP1R and the driver transistor 12DNR and access transistor 12ANR are formed in the single well WP2R, and the N$^+$-type impurity regions FN10R and FN11R constituting these transistors are greatly responsible for the occurrence of soft errors.

In this regard, the driver transistor 11DN and access transistor 11AN are formed in the different wells W2P and W1P which are not in contact with each other (besides, with the well W4N interposed therebetween) in the semiconductor memory 1. Here, with the semiconductor memory 1, the conventional N$^+$-type impurity region FN10R is taken as being divided into the N$^+$-type impurity regions FN30 and 10 formed in the different wells W2P and W1P, respectively. In this way, part of the conventional semiconductor memory 1R that is greatly responsible for the occurrence of soft errors is divided in the semiconductor memory 1, which can reduce the sensitivity of the storage node 11b to incident α-rays and the like as compared to the conventional semiconductor memory 1R. The same applies to the storage node 12b. That is, the soft error immunity can be improved.

Figure 9:
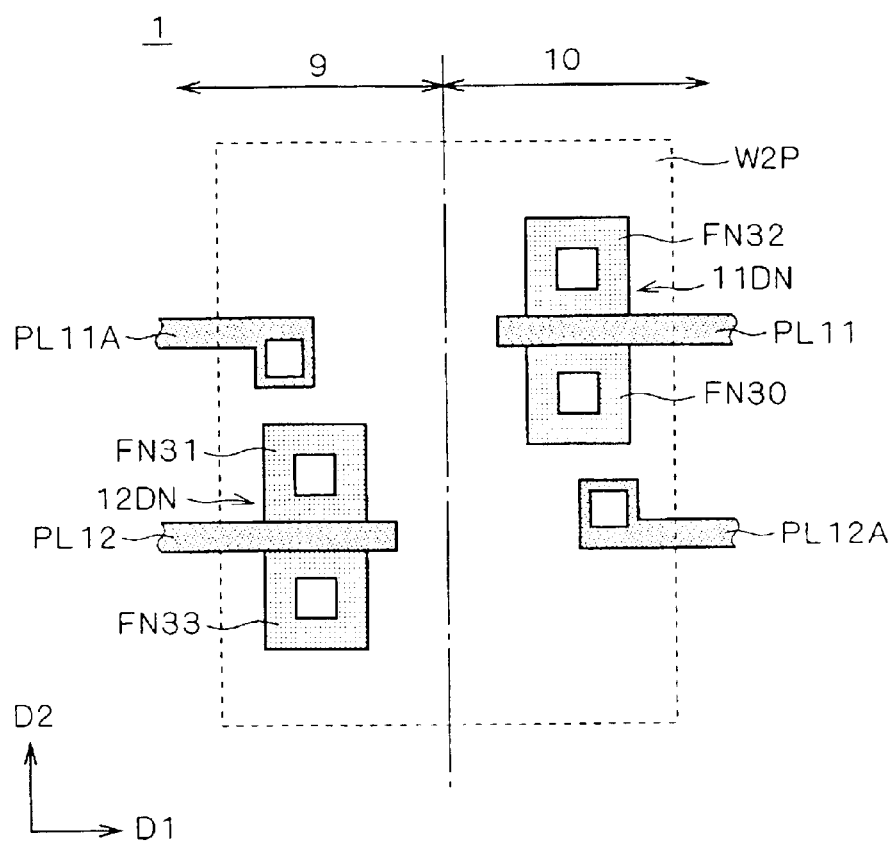
FIG. 9 is a layout view showing the semiconductor memory according to the first preferred embodiment.

In view of the effect of common mode noise as mentioned above, the soft error immunity can further be improved by arranging wells so as to be shared by the memory cell 10 and a memory cell 9 adjacent to the memory cell 10 in the first direction D1 as shown in FIG. 9. Here, the adjacent memory cell is designated by the reference numeral "9" for description, and the memory cell 9 shall have the same structure as the aforementioned memory cell 10.

Specifically, in the structure shown in FIG. 9, the adjacent memory cell 9 is formed on the side of the second well W2P of the memory cell 10. The first driver transistor 11DN of the memory cell 10 as well as the second driver transistor 12DN of the adjacent memory cell 9 are formed in the second well W2P of the memory cell 10. That is, the second well W2P of the memory cell 10 also serves as the third well W3P of the adjacent memory cell 9.

Likewise, the third well W3P of the memory cell 10 may be configured to also serve as the second well W2P of a memory cell 9 adjacent on the side of the third well W3P of the memory cell 10.

Alternately, in the case where the memory cell 10 and the adjacent memory cell 9 are provided symmetrically with respect to a line, the second well W2P of the memory cell 10 may be configured to also serve as the second well W2P of the adjacent memory cell 9, or the third well W3P may be shared by the respective memory cells 10 and 9.

Further, as has been described (cf. FIG. 3), the gates G of the transistors 11DN, 11LP and 11AN are aligned in the first direction D1, while the gates G of the transistors 12DN, 12LP and 12AN are aligned in the first direction D1. Moreover, the gates G of the two load transistors 11LP and 12LP are not aligned in the first direction D1. That is, the gates G of the transistors 11DN, 11LP, 11AN, 12DN, 12LP and 12AN are aligned in two lines. Therefore, the semiconductor memory 1 achieves high speed operation and low power consumption. This is ascribed to the following reason.

For instance, when the gates G of all the transistors 11DN, 11LP, 11AN, 12DN, 12LP and 12AN are aligned in the first direction D1, it will become necessary to form the gate interconnect lines PL11, Pl12, PL11A and PL12A to meander, which thus increases the memory cell 10 in size in the first direction D1. On the contrary, when none of the gates G of the transistors 11DN, 11LP, 11AN, 12DN, 12LP and 12AN is aligned in the first direction D1, for instance, the memory cell 10 will be increased in size in the second direction D2. That is, the semiconductor memory 1 can prevent the memory cell 10 to increase in size in the first direction D1 as well as in the second direction D2. Accordingly, the word line WL extending in the first direction D1 and the bit lines BL1 and BL2 extending in the second direction D2 can be reduced in wiring capacitance at the same time. As a result, high speed operation and low power consumption become possible.

The semiconductor memory 1 can be manufactured without increasing the manufacturing steps as compared to those of the conventional semiconductor memory 1R.

Second Preferred Embodiment

FIG. 10 is a circuit diagram showing a semiconductor memory 2 according to a second preferred embodiment. As will be appreciated from comparison between FIGS. 10 and 1, the semiconductor memory 2 has basically the same structure as the semiconductor memory 1 as above described except that the driver transistors 11DN and 12DN are replaced by driver transistors 21DN and 22DN. Since the other components are the same in the semiconductor memories 1 and 2, the same components are designated by the aforementioned reference characters.

Specifically, in a memory cell 20 of the semiconductor memory 2, the first driver transistor 21DN is formed by two N-type MOSFETs 21DN1 and 21DN2, which have both sources connected to each other and both drains connected to each other, that is, the MOSFETs are connected in parallel. The first driver transistor 21DN as well as the first load transistor 11LP constitute a first inverter 21 of the memory cell 20. The gates of the two MOSFETs 21DN1 and 21DN2 are connected to the gate of the first load transistor 11LP.

Likewise, the second driver transistor 22DN of the memory cell 20 is formed by two N-type MOSFETs 22DN1 and 22DN2 connected in parallel. The second driver transistor 22DN as well as the second load transistor 12LP constitute a second inverter 22 of the memory cell 20.

Figure 11:
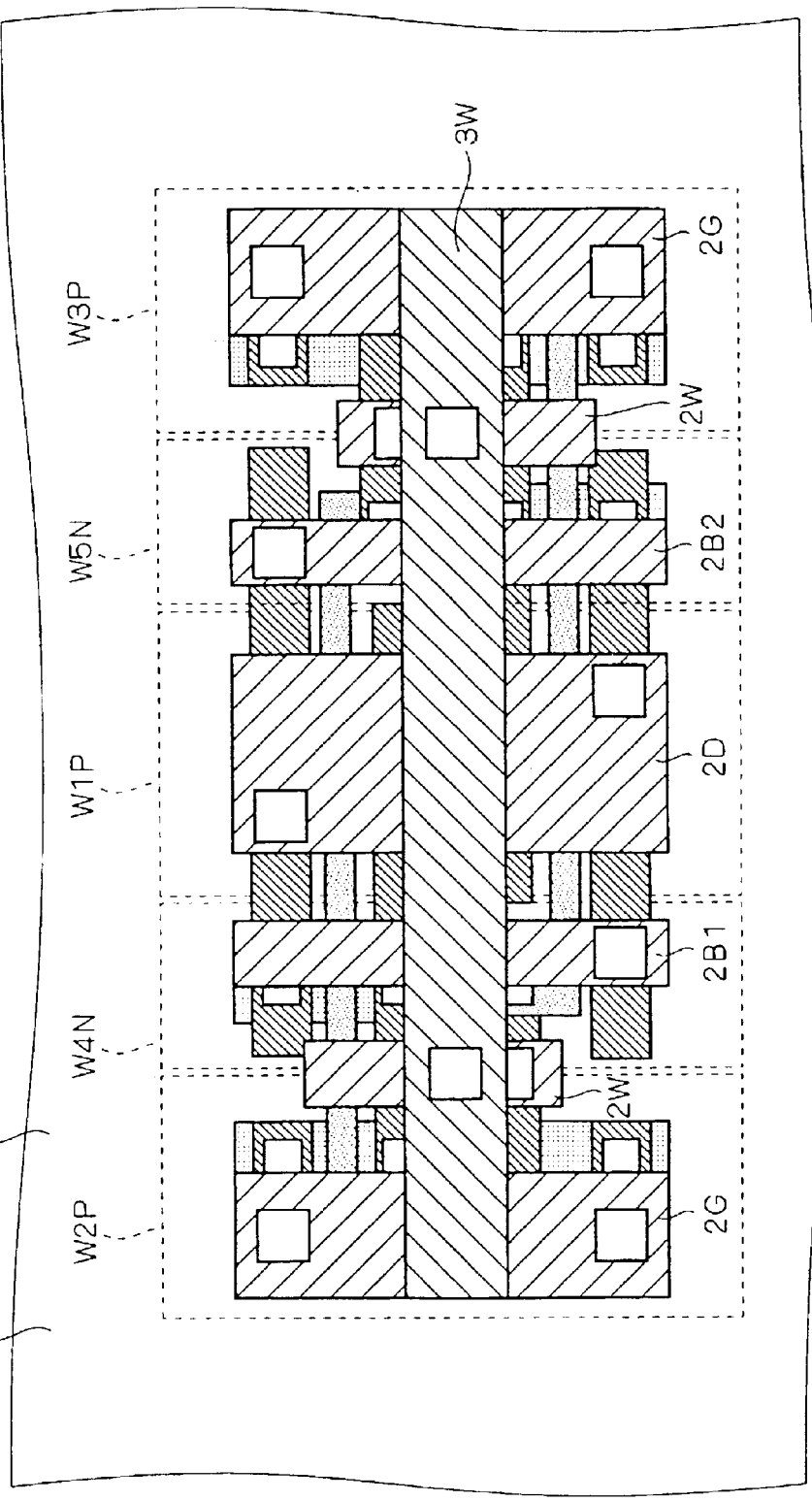
FIGS. 11 through 15 are layout views showing the semiconductor memory according to the second preferred embodiment.

Next, a specific structure of the semiconductor memory 2 will be described referring to layout views (plan views) shown in FIGS. 11 to 15. Part of components of the semiconductor memory 2 shown in FIG. 11 is extracted and shown in FIGS. 12 to 15.

As shown in FIGS. 11 to 15, the five wells W2P, W4N, W1P, W5N and W3P are formed in the main surface 5S of the semiconductor substrate 5 and are aligned in this order in the first direction D1, similarly to the aforementioned semiconductor memory 1.

Figure 12:
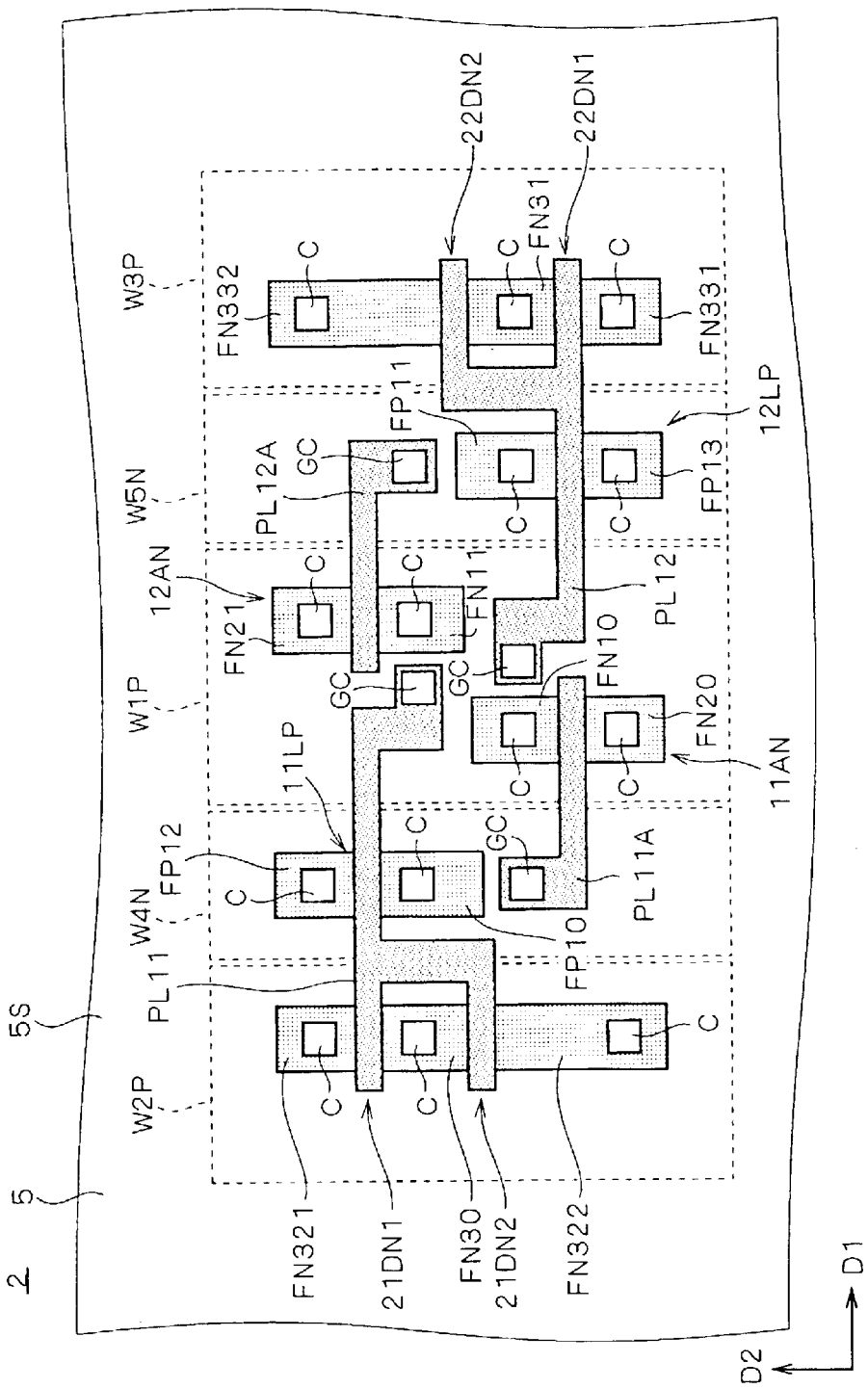

Further, as shown in FIG. 12, similarly to the aforementioned semiconductor memory 1, the first and second N-type access transistors 11AN and 12AN are both formed in the first P-well W1P. The two N-type MOSFETs 21DN1 and 21DN2 constituting the first driver transistor 21DN are formed in the second P-well W2P. Likewise, the two N-type MOSFETs 22DN1 and 22DN2 constituting the second driver transistor 22DN are formed in the third P-well W3P. Further, the first and second load transistors 11LP and 12LP are formed in the fourth and fifth N-wells W4N and W5N, similarly to the aforementioned semiconductor memory 1.

Specifically, in the first P-well W1P, the two impurity regions FN10 and FN20 of the first access transistor 11AN are aligned in the second direction D2 with a channel region of the transistor 11AN interposed therebetween, and the two impurity regions FN11 and FN21 of the second access transistor 12AN are aligned in the second direction D2 with a channel region of the transistor 12AN interposed therebetween. Here, the semiconductor memory 2 is provided such that these four impurity regions FN10, FN20, FN11 and FN21 are not aligned in the first direction D1. Further, in the semiconductor memory 2, the impurity regions FN10 and FN20 of the first access transistor 11AN are arranged closer to the fourth well W4N than the impurity regions FN11 and FN21 of the second access transistor 12AN.

In the second P-well W2P, three impurity regions FN321, FN30 and FN322 are formed in the main surface 5S and are aligned in the second direction D2. More specifically, the impurity regions FN321 and FN30 are provided with the channel region CH of the MOSFET 21DN1 interposed therebetween, and the impurity regions FN30 and FN322 are provided with the channel region CH of the MOSFET 21DN2 interposed therebetween. Here, the impurity region FN30 is shared by the two MOSFETs 21DN1 and 21DN2.

Likewise, in the third P-well W3P, three impurity regions FN331, FN31 and FN332 are formed in the main surface 5S and are aligned in the second direction D2. More specifically, the impurity regions FN331 and FN31 are provided with the channel region CH of the MOSFET 22DN1 interposed therebetween, and the impurity regions FN31 and FN332 are provided with the channel region CH of the MOSFET 22DN2 interposed therebetween. Here, the impurity region FN31 is shared by the two MOSFETs 22DN1 and 22DN2.

Further, in the fourth N-well W4N, the two impurity regions FP10 and FP12 of the first load transistor 11LP are formed and are aligned in the second direction D2 with the channel region CH of the transistor 11LP interposed therebetween. Likewise, in the fifth N-well W5N, the two impurity regions FP11 and FP13 of the second load transistor 12LP are formed and are aligned in the second direction D2 with the channel region CH of the transistor 12LP interposed therebetween.

Here, the impurity regions FN321, FN30, FP12, FP10, FN21 and FN11 are provided such that the channel regions CH of the MOSFET 21DN1 of the first driver transistor 21DN, first load transistor 11LP and second access transistor 12AN are aligned in the first direction D1. Further, the impurity regions FN331, FN31, FP13, FP11, FN20 and FN10 are provided such that the channel regions CH of the MOSFET 22DN1 of the second driver transistor 22DN, second load transistor 12LP and first access transistor 11AN are aligned in the first direction D1.

The impurity regions FN321, FP12 and FN21 are aligned in the first direction D1, and the impurity regions FN331, FP13 and FN20 are similarly aligned in the first direction D1. Further, the impurity regions FN30, FP10 and FN11 are aligned in the first direction D1, and the impurity regions FN31, FP11 and FN10 are similarly aligned in the first direction D1. Further, the impurity region FN322 is formed to be opposite to the two impurity regions FN10 and FN20, and the impurity region FN332 is similarly formed to be opposite to the two impurity regions FN11 and FN21.

Further, as shown in FIG. 12, the gate interconnect line PL11 extends in the first direction D1 so as to be opposite to the channel regions CH of the MOSFET 21DN1 and first load transistor 11LP with a gate oxide film (not shown) interposed therebetween. In the plan view, the gate interconnect line PL11 further extends above the well W1P, then turns to the second direction D2 toward the impurity region FN10, and extends again in the first direction D1 to reach the vicinity of the impurity region FN11. In the semiconductor memory 2, however, the gate interconnect line PL11 is not in contact with the impurity region FN11. In the semiconductor memory 2, the gate interconnect line PL11 is branched off in the vicinity of the border between the wells W2P and W4N in the plan view to extend between the impurity regions FN30 and FP10 in the second direction D2, and then extends in the first direction D1 to be opposite to the channel region CH of the MOSFET 21DN2 with a gate oxide film (not shown) interposed therebetween. The gates G of the three transistors 21DN1, 21DN2 and 11LP are connected in common with such gate interconnect line PL11 (cf. FIG. 10).

Likewise, the gate interconnect line PL12 extends in the first direction D1 so as to be opposite to the channel regions CH of the MOSFET 22DN1 and second load transistor 12LP with a gate oxide film (not shown) interposed therebetween. In the plan view, the gate interconnect line PL12 further extends above the well W1P, then turns to the second direction D2 toward the impurity region FN11, and extends again in the first direction D1 to reach the vicinity of the impurity region FN10. In the semiconductor memory 2, however, the gate interconnect line PL12 is not in contact with the impurity region FN10. In the semiconductor memory 2, the gate interconnect line PL12 is branched off in the vicinity of the border between the wells W3P and W5N in the plan view to extend between the impurity regions FN31 and FP11 in the second direction D2, and then extends in the first direction D1 to be opposite to the channel region CH of the MOSFET 22DN2 with a gate oxide film (not shown) interposed therebetween. The gates G of the three transistors 22DN1, 22DN2 and 12LP are connected in common with such gate interconnect line PL12 (cf. FIG. 10).

Further, the gate interconnect line PL11A extends in the first direction D1 above the wells W1P and W4N in the plan view so as to be opposite to the channel region CH of the access transistor 11AN with a gate oxide film (not shown) interposed therebetween. Likewise, the gate interconnect line PL12A extends in the first direction D1 above the wells W1P and W5N in the plan view so as to be opposite to the channel region CH of the access transistor 12AN with a gate oxide film (not shown) interposed therebetween. The gate interconnect lines PL11A and PL12A extend in the second direction D2 above the wells W4N and W5N toward the impurity regions FP10 and FP11, respectively, in the plan view.

Here, in the semiconductor memory 2, the gates G of the transistors 21DN1, 11LP and 12AN are aligned in the first direction D1, while those of the transistors 22DN1, 12LP and 11AN are aligned in the first direction D1. The gates G of the two load transistors 11LP and 12LP are not aligned in the first direction D1.

The interlayer insulation film 7 (cf. FIG. 8) is provided on the main surface 5S of the semiconductor substrate 5 to cover the impurity region FN321 and the like and the gate interconnect lines PL11, PL12, PL11A and PL12A. Contact holes C and GC are formed in the interlayer insulation film 7. The contact holes C are provided on the impurity regions FN321, FN30, FN322, FP10, FP12, FN10, FN20, FN11, FN21, FP11, FP13, FN331, FN31 and FN332, respectively. The gate contact holes GC are provided on the gate interconnect lines PL11 and PL12, respectively, above the well W1P in the plan view, while the gate contact holes GC are provided on the gate interconnect lines PL11A and PL12A above the wells W4N and W5N, respectively, in the plan view.

In the semiconductor memory 2, the contact holes C on the impurity regions FN321, FP12, FN21 and FN332 are aligned in the first direction D1, while the contact holes C on the impurity regions FN30, FP10 and FN11 and the gate contact holes GC on the gate interconnect lines PL11 and PL12A are aligned in the first direction D1. Likewise, the contact holes C on the impurity regions FN331, FP13, FN20 and FN322 are aligned in the first direction D1, while the contact holes C on the impurity regions FN31, FP11 and FN10 and the gate contact holes GC on the gate interconnect lines PL12 and PL11A are aligned in the first direction D1.

Figure 13:
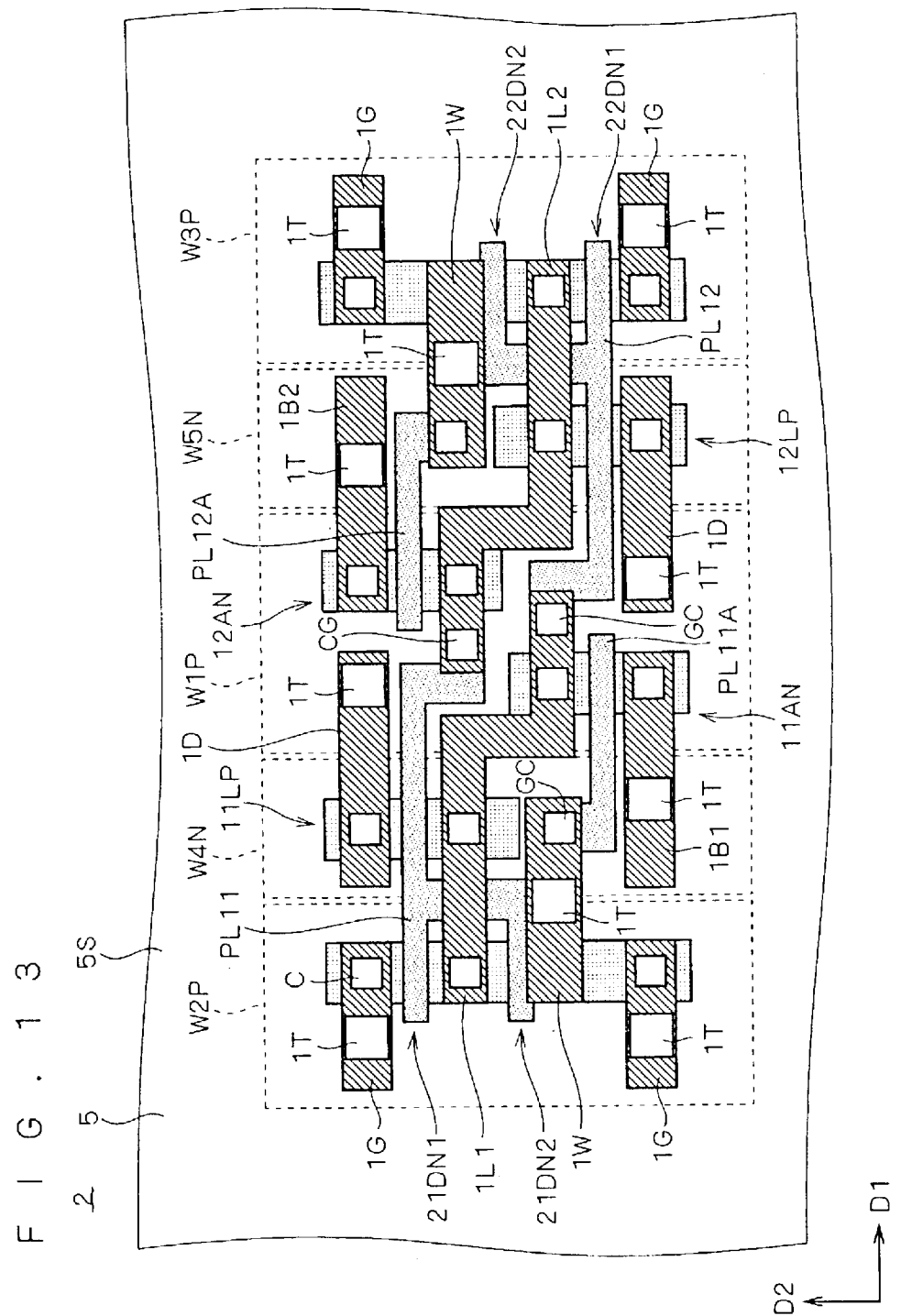

As will be appreciated from FIGS. 12 and 13, the first layer interconnect lines 1G, 1W, 1D, 1B1, 1B2, 1L1 and 1L2 are provided on the interlayer insulation film 7. An interlayer insulation film (not shown) is provided to cover these interconnect lines 1G, 1W, 1D, 1B1, 1B2, 1L1 and 1L2 and is provided with via holes 1T.

Specifically, the interconnect lines 1G are provided above the impurity regions FN321, FN322, FN331 and FN332, respectively. These four interconnect lines 1G are in contact with the impurity regions FN321, FN322, FN331 and FN332 provided below through the contact holes C, respectively. The interconnect lines 1G extend in the first direction D1. The via holes 1T are each provided on the interconnect lines 1G, respectively, on the side far from the fourth and fifth wells W4N and W5N, and two of the via holes 1T provided above the same well are aligned in the second direction D2.

The interconnect lines 1W, 1D, 1B1 and 1B2 are provided similarly to those in the semiconductor memory 1. That is, the interconnect lines 1W are provided on the gate interconnect lines PL11A and PL12A, respectively, in the plan view and are in contact with the gate interconnect lines PL11A and PL12A, respectively, through gate contact holes GC. The interconnect lines 1D are provided on the impurity regions FP12 and FP13, respectively, in the plan view and are in contact with the impurity regions FP12 and FP13, respectively, through the contact holes C. The interconnect lines 1B1 and 1B2 are provided on the impurity regions FN20 and FN21, respectively, in the plan view and are in contact with the impurity regions FN20 and FN21, respectively, through the contact holes C. The interconnect lines 1W, 1D, 1B1 and 1B2 extend in the first direction D1.

The via holes 1T on the interconnect lines 1W are provided in the vicinity of the border between the wells W2P and W4N and the border between the wells W3P and W5N, respectively. The via holes 1T on the interconnect lines 1D are both provided above the well W1P. The via holes 1T on the interconnect lines 1B1 and 1B2 are provided above the wells W4N and W5N, respectively.

The impurity regions and gate interconnect lines connected with the interconnect lines 1L1 and 1L2 are the same as in the respective semiconductor memories 1 and 2. Specifically, the interconnect line 1L1 extends in the first direction D1 in the plan view from above the impurity region FN30 over the impurity region FP10 to reach above the well 1P. The interconnect line 1L1 then extends in the second direction D2 toward the gate interconnect line PL11A above the well W1P, turns again to the first direction D1 before reaching the gate interconnect line PL11A and extends over the impurity region FN10 to reach above the gate contact hole GC on the gate interconnect line PL12. The interconnect line 1L1 is in contact with the impurity regions FN30, FP10 and FN10 and gate interconnect line PL12 through the contact holes (or first contact holes) C, GC.

Likewise, the interconnect line 1L2 extends in the first direction D1 from above the impurity region FN31 over the impurity region FP11 to reach the well W1P. The interconnect line 1L2 then extends in the second direction D2 toward the gate interconnect line PL12A, turns again to the first direction D1 before reaching the gate interconnect line PL12A and extends over the impurity region FN11 to reach the gate contact hole GC on the gate interconnect line PL11. The interconnect line 1L2 is in contact with the impurity regions FN31, FP11 and FN11 and gate interconnect line PL11 through the contact holes (or second contact holes) C, GC.

Although the shared contact structure (cf. FIGS. 3 and 8) is not applicable in the case where the gate interconnect lines PL11 and PL12 are not in contact with the impurity regions FN11 and FN10, respectively, as in the semiconductor memory 2, the interconnect lines 1L1 and 1L2 can provide electric connection between the impurity regions FN11, FN10 and gate interconnect lines PL11, PL12, respectively.

Figure 14:
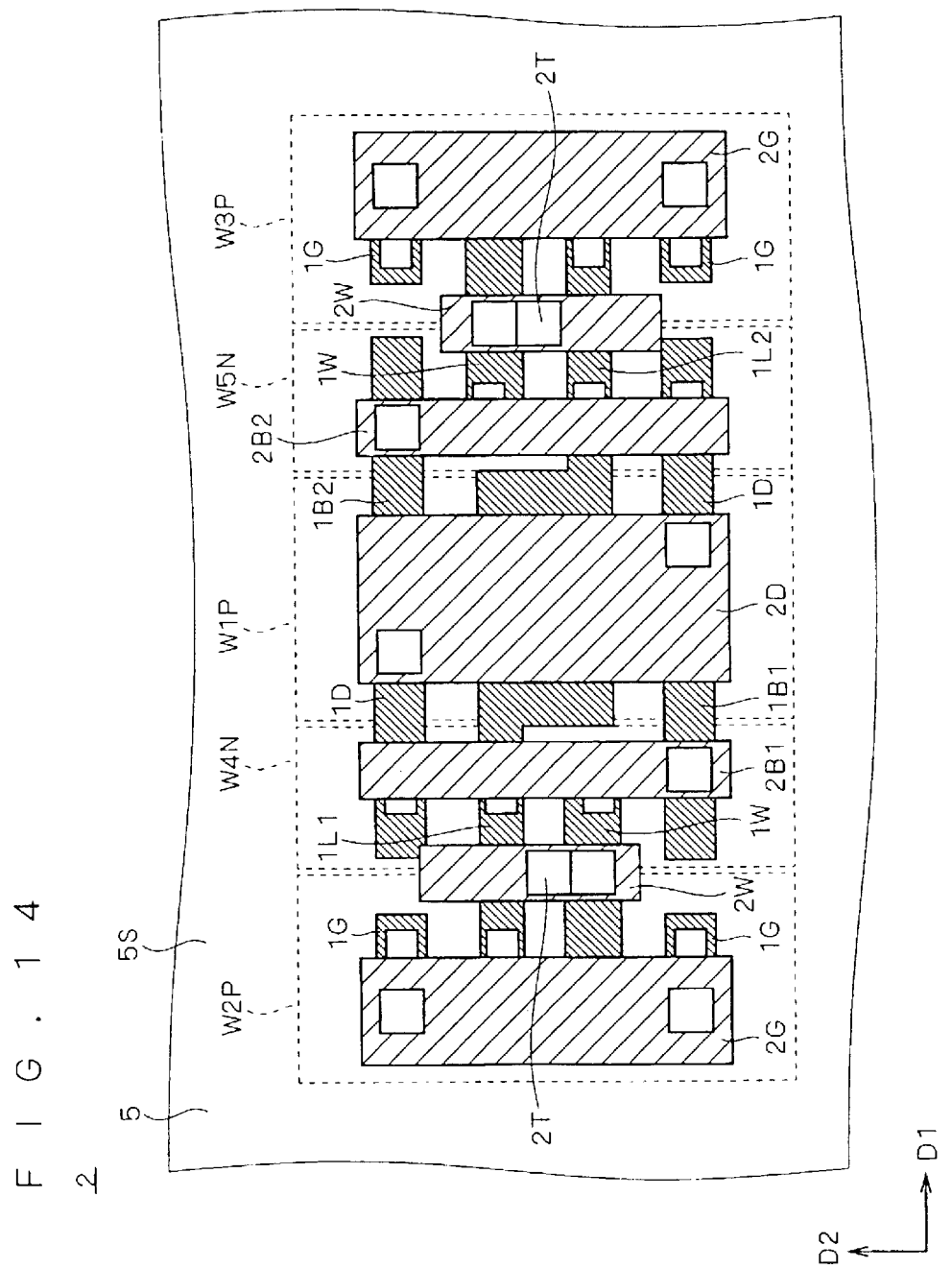

Next, as will be appreciated from FIGS. 13 and 14, the second layer interconnect lines 2G, 2W, 2D, 2B1 and 2B2 are provided on the interlayer insulation film (not shown) covering the first layer interconnect lines 1G, 1W, 1D, 1B1, 1B2, 1L1 and 1L2, similarly to the semiconductor memory 1 (cf. FIG. 5). The interconnect lines 2G, 2W, 2D, 2B1 and 2B2 are in contact with the interconnect lines 1G, 1W, 1D, 1B1 and 1B2 provided below through the via holes 1T, respectively. In the semiconductor memory 2, two of the interconnect lines 1G are provided below each of the interconnect lines 2G, and the interconnect lines 2G are each in contact with both the two of the interconnect lines 1G.

An interlayer insulation film (not shown) is provided to cover these interconnect lines 2G, 2W, 2D, 2B1 and 2B2 and is provided with via holes 2T.

Figure 15:
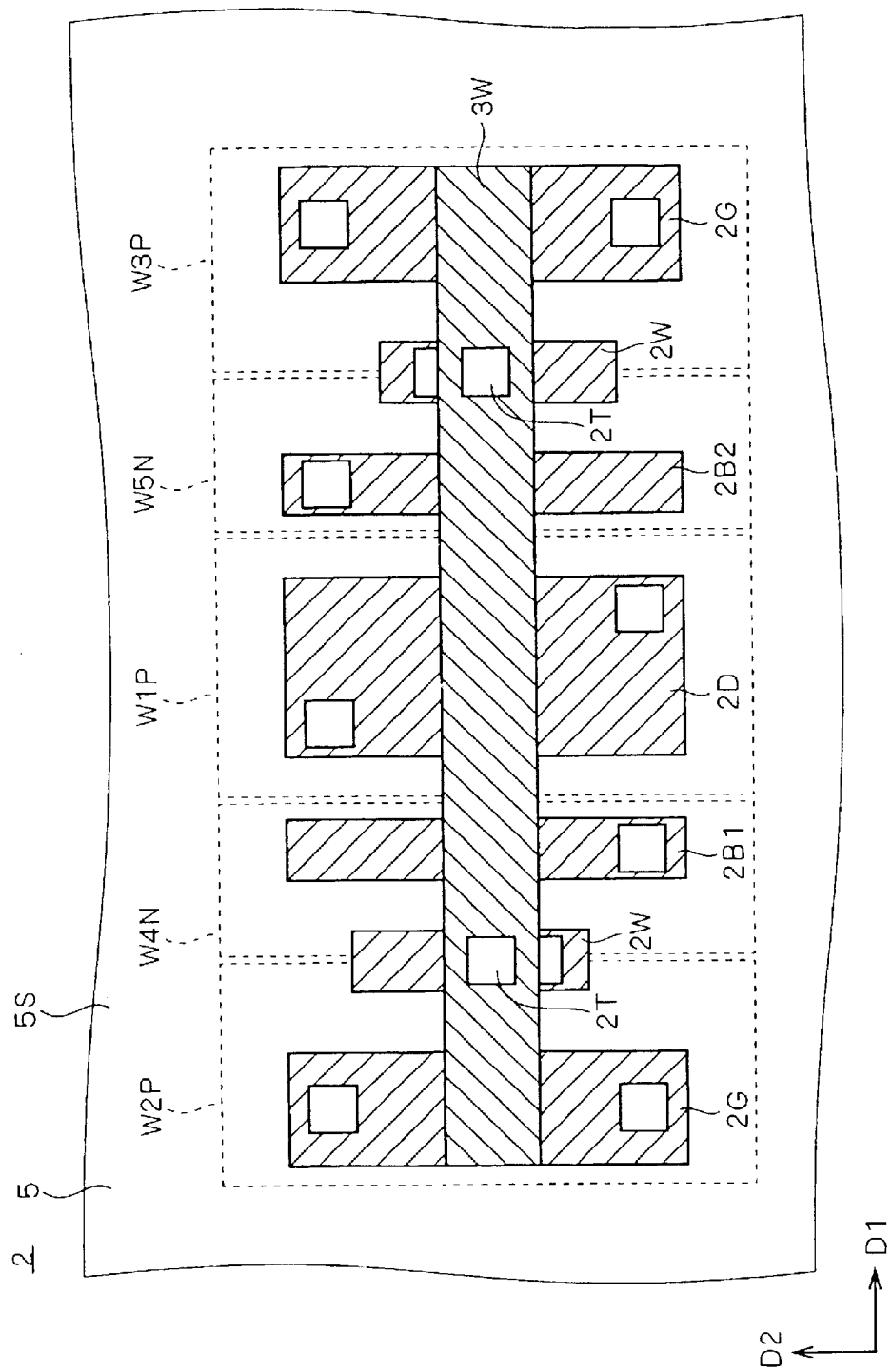

As will be appreciated from FIGS. 14 and 15, third layer interconnect line 3W is provided on the interlayer insulation film (not shown) covering the second layer interconnect lines 2W, 2G, 2B1, 2B2 and 2D, similarly to the aforementioned semiconductor memory 1 (cf. FIG. 6) and is in contact with the interconnect lines 2W provided below through the via holes 2T.

The semiconductor memory 2 achieves the following effects together with the same effects as those achieved by the semiconductor memory 1.

Since the first driver transistor 21DN is formed by the two MOSFETs 21DN1 and 21DN2 connected in parallel, the channel width (corresponding to the gate width WG (cf. FIG. 7) of the first driver transistor 21DN can be increased as compared to that of the first access transistor 11AN. The same applies to the second driver transistor 22DN. Here, a value given by (main current of driver transistor (source-drain current))/(main current of access transistor) is an index showing the stability of the memory cell 10. As the value increases, the stability of the memory cell 10 increases. In view of the fact that the aforementioned main current is in proportion to the value given by (channel width)/(channel length), the stability of the memory cell 10 increases as the value given by (channel width of driver transistor)/(channel width of access transistor) increases. Thus, the memory cell 20 can be operated with more stability than the above-described memory cell 10.

Besides, since the impurity regions FN321, FN30 and FN322 of the two MOSFETs 21DN1 and 21DN2 are aligned in the second direction D2, the memory cell 20 can be reduced in size in the first direction D1, thus achieving miniaturization even when the two MOSFETs 21DN1 and 21DN2 are included. The same applies to the second driver transistor 22DN.

As described above, the semiconductor memory 2 can achieve improved stability and miniaturization at the same time. Further, such miniaturization allows the bit lines BL1, BL2 and word line WL to be shortened, i.e. allows the bit lines BL1, BL2 and word line WL to be reduced in capacity, which can achieve high speed operation and low power consumption.

The respective driver transistors 21DN and 22DN may be formed by three or more MOSFETs connected in parallel.

Variant

In the semiconductor memories 1 and 2, the inverters 11, 12, 21 and 22 may be modified into so-called high resistance type inverters by replacing the load transistors 11LP and 12LP by high resistance elements.

Further, the conductivity types (N- and P-types) of the respective MOSFETs may be reversed to each other.

While the invention has been shown and described in detail, the foregoing description is in all aspects illustrative and not restrictive. It is therefore understood that numerous modifications and variations can be devised without departing from the scope of the invention.

What is claimed is:

1. A semiconductor memory comprising:

a semiconductor substrate; and a memory cell formed in said semiconductor substrate, wherein said memory cell includes:

a first inverter having a first input terminal and a first output terminal, said first inverter further having at least one MISFET of a first conductivity type as a first driver transistor, said at least one MISFET having a main terminal connected to said first output terminal;

a second inverter having a second input terminal connected to said first output terminal and a second output terminal connected to said first input terminal, said second inverter further having at least one MISFET of said first conductivity type as a second driver transistor, said at least one MISFET having a main terminal connected to said second output terminal;

a first access transistor formed by a MISFET of said first conductivity type having a main terminal connected to said first output terminal; and a second access transistor formed by a MISFET of said first conductivity type having a main terminal connected to said second output terminal, said semiconductor substrate includes first to third wells of a second conductivity type opposite to said first conductivity type, said first to third wells are not in contact with one another, said first and second access transistors are both formed in said first well, said first driver transistor is formed in said second well, and said second driver transistor is formed in said third well.

2. The semiconductor memory according to claim 1, further comprising an adjacent memory cell adjacent to said memory cell on the side of said second or third well, wherein said second or third well of said memory cell also serves as one of said second and third wells of said adjacent memory cell.

3. The semiconductor memory according to claim 1, wherein said semiconductor substrate further includes:

a fourth well of said first conductivity type formed between said first and second wells; and a fifth well of said first conductivity type formed between said first and third wells.

4. The semiconductor memory according to claim 1, wherein said at least one MISFET of each of said first and second driver transistors includes a plurality of MISFETs connected in parallel, said second, first and third wells are aligned in this order in a certain direction, and impurity regions corresponding to main terminals of said plurality of MISFETs are aligned in a direction perpendicular to said certain direction.

5. The semiconductor memory according to claim 3, wherein said first inverter is formed in said fourth well and further includes a MISFET of said second conductivity type as a first load transistor, said MISFET having a main terminal connected to said first output terminal, said second inverter is formed in said fifth well and further includes a MISFET of said second conductivity type as a second load transistor, said MISFET having a main terminal connected to said second output terminal, said second, fourth, first, fifth and third wells are aligned in this order in a certain direction, gates of said MISFETs respectively constituting said first and second load transistors are not aligned in said certain direction, and gates of said MISFETs respectively constituting said first and second driver transistors and said first and second access transistors are aligned in said certain direction with one of said gates of said first and second load transistors.

6. The semiconductor memory according to claim 3, wherein said first inverter is formed in said fourth well and further includes a MISFET of said second conductivity type as a first load transistor, said MISFET having a main terminal connected to said first output terminal, said second inverter is formed in said fifth well and further includes a MISFET of said second conductivity type as a second load transistor, said MISFET having a main terminal connected to said second output terminal, said semiconductor memory further comprising:
- a first gate interconnect line forming gates of said first driver transistor and said first load transistor;
- a second gate interconnect line forming gates of said second driver transistor and said second load transistor;
- a first interconnect line being in contact with impurity regions and said second gate interconnect line through first contact holes, said impurity regions corresponding to said main terminals respectively provided for said first driver transistor, said first load transistor and said first access transistor, said main terminals each being connected to said first output terminal; and
- a second interconnect line being in contact with impurity regions and said first gate interconnect line through second contact holes, said impurity regions corresponding to said main terminals respectively provided for said second driver transistor, said second load transistor and said second access transistor, said main terminals each being connected to said second output terminal, wherein
    - said second gate interconnect line is in contact with said impurity region of said first access transistor, and said first contact holes include a first shared contact hole, to the inside of which said second gate interconnect line and said impurity region of said first access transistor are both exposed, and
    - said first gate interconnect line is in contact with said impurity region of said second access transistor, and said second contact holes include a second shared contact hole, to the inside of which said first gate interconnect line and said impurity region of said second access transistor are both exposed.

7. The semiconductor memory according to claim 3, wherein said first inverter is formed in said fourth well and further includes a MISFET of said second conductivity type as a first load transistor, said MISFET having a main terminal connected to said first output terminal, said second inverter is formed in said fifth well and further includes a MISFET of said second conductivity type as a second load transistor, said MISFET having a main terminal connected to said second output terminal, said semiconductor memory further comprising:
- a first gate interconnect line forming gates of said first driver transistor and said first load transistor;
- a second gate interconnect line forming gates of said second driver transistor and said second load transistor;
- a first interconnect line being in contact with impurity regions and said second gate interconnect line through first contact holes, said impurity regions corresponding to said main terminals respectively provided for said first driver transistor, said first load transistor and said first access transistor, said main terminals each being connected to said first output terminal; and
- a second interconnect line being in contact with impurity regions and said first gate interconnect line through second contact holes, said impurity regions corresponding to said main terminals respectively provided for said second driver transistor, said second load transistor and said second access transistor, said main terminals each being connected to said second output terminal, wherein
    - said first and second gate interconnect lines are not in contact with said impurity regions of said second and first access transistors, and
    - said first and second contact holes are provided on said impurity regions, and said first and second gate interconnect lines, respectively.

* * * * *

UNITED STATES PATENT AND TRADEMARK OFFICE
CERTIFICATE OF CORRECTION

PATENT NO. : 6,734,573 B2
DATED : May 11, 2004
INVENTOR(S) : Yoshinori Okada

Page 1 of 1

It is certified that error appears in the above-identified patent and that said Letters Patent is hereby corrected as shown below:

Column 18,
Lines 39 and 60, replace "said first inverter is formed in said fourth well and further" with -- said first inverter further --.
Lines 43 and 64, replace "said second inverter is formed in said fifth well and further" with -- said second inverter further --.

Column 20,
Line 1, replace "said first inverter is formed in said fourth well and further" with -- said first inverter further --.
Line 5, replace "said second inverter is formed in said fifth well and further" with -- said second inverter further --.

Signed and Sealed this

Sixth Day of June, 2006

JON W. DUDAS
*Director of the United States Patent and Trademark Office*